United States Patent
Matsuoka et al.

(10) Patent No.: US 7,819,080 B2
(45) Date of Patent: Oct. 26, 2010

(54) SUBSTRATE PROCESSING APPARATUS AND SUBSTRATE PROCESSING METHOD

(75) Inventors: Nobuaki Matsuoka, Koshi (JP); Yoshio Kimura, Koshi (JP); Akira Miyata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 955 days.

(21) Appl. No.: 10/585,975

(22) PCT Filed: Nov. 11, 2004

(86) PCT No.: PCT/JP2004/016724

§ 371 (c)(1),
(2), (4) Date: Jul. 13, 2006

(87) PCT Pub. No.: WO2005/069365

PCT Pub. Date: Jul. 28, 2005

(65) Prior Publication Data

US 2007/0186850 A1    Aug. 16, 2007

(30) Foreign Application Priority Data

Jan. 16, 2004   (JP)   .............................. 2004-009675

(51) Int. Cl.
B05C 11/00  (2006.01)
B05C 11/02  (2006.01)
G03D 5/00   (2006.01)

(52) U.S. Cl. ........................ 118/695; 118/696; 118/686; 118/702; 118/52; 118/66; 396/611

(58) Field of Classification Search ............... 118/52, 118/612, 319, 320, 326, 50, 500, 66, 695–699, 118/686, 702; 414/217, 719, 331.04, 416.03, 414/416.08, 937, 940, 223.01, 749.1; 134/198, 134/153; 396/611, 627, 604; 355/27; 427/240

See application file for complete search history.

(56) References Cited

U.S. PATENT DOCUMENTS

| 6,168,667 | B1 |   | 1/2001 | Yoshioka |
| 6,377,329 | B1 | * | 4/2002 | Takekuma ................... 355/27 |
| 6,851,872 | B1 | * | 2/2005 | Okubo et al. ............... 396/611 |
| 7,322,756 | B2 | * | 1/2008 | Akimoto et al. ............. 396/611 |

FOREIGN PATENT DOCUMENTS

| JP | 5-343497 | 12/1993 |
| JP | 08-162514 | 6/1996 |
| JP | 10-144765 | 5/1998 |
| JP | 11-163079 | 6/1999 |
| JP | 2000-124124 | 4/2000 |

* cited by examiner

*Primary Examiner*—Yewebdar T Tadesse
(74) *Attorney, Agent, or Firm*—Oblon, Spivak, McClelland, Maier & Neustadt, L.L.P.

(57) ABSTRACT

A substrate transfer system to reduce total processing time by transferring a substrate at a first delivery stage to a process block where processing can be carried out earliest. The substrate processing apparatus includes a first transfer device delivering a wafer with respect to a substrate carrier, and a second transfer device delivering a wafer between a plurality of process blocks and the first transfer device via a first delivery stage, to transfer the wafer with respect to the process blocks. The process block where there is no wafer or where processing of the last wafer within the relevant process block will be completed earliest is determined based on processing information of the wafers from the process blocks, and the wafer of the first delivery stage is transferred by the second transfer device to the relevant process block. This ensures smooth transfer of the wafer to the process block.

11 Claims, 16 Drawing Sheets

SUBSTRATE PROCESSING APPARATUS AND SUBSTRATE PROCESSING METHOD

TECHNICAL FIELD

The present invention relates to a substrate processing apparatus and a substrate processing method that perform prescribed substrate processing, such as coating of a resist solution and developing after exposure to light, by applying a process solution on a surface of a substrate, such as a semiconductor wafer or an LCD substrate (glass substrate for liquid crystal display).

BACKGROUND ART

In a manufacturing process of a semiconductor device, photolithography is used, where a substrate such as a semiconductor wafer (hereinafter, referred to as a "wafer") is coated with a resist solution, and the resist film is exposed to light using a photo mask and then developed to thereby form a desired resist pattern on the substrate. Such processing is generally carried out using a substrate processing apparatus having a light exposure device connected to a coating and developing device used for coating of the resist solution and developing.

In order to reduce the area occupied by the apparatus while ensuring high throughput, the substrate processing apparatus is configured such that different kinds of processing, such as coating, developing, and heating/cooling, are performed on a substrate using separate units, and a required number of such units for each processing are incorporated in the apparatus. Transfer means for loading/unloading a substrate to/from each process unit is also provided.

An example of such a substrate processing apparatus will be described with reference to a configuration of Patent Document 1. In FIG. 16, 11 represents a carrier stage 11 to/from which a carrier 10 containing 25 wafers W, for example, is loaded/unloaded. For example, three process blocks 12A, 12B, 12C are connected to carrier stage 11, and a light exposure device 12E is connected to the third process block 12C via an interface block 12D. Process blocks 12A, 12B, 12C include transfer means 13A, 13B, 13C, respectively, at the centers, and around the means, first and second process blocks 12A, 12B have coating units 14A, 14B, respectively, for coating a wafer with a coating solution, third process block 12C has a developing unit 15 for performing developing of the wafer after exposure to light, and all process blocks 12A-12C include shelf units 16A-16G provided with heating unit, cooling unit, delivery unit and others for performing prescribed heating or cooling processing on the wafer before or after the processing by coating unit 14 or developing unit 15.

In this apparatus, the wafers in carrier 10 on carrier stage 11 are taken out by a delivery arm 17, and transferred via a delivery unit of shelf unit 16A to first process block 12A, and then sequentially transferred to unoccupied process units in first and second process blocks 12A, 12B in a prescribed order to be subjected to the coating processing of the resist solution, and then transferred via process block 12C and interface block 12D to light exposure device 12E, where prescribed light exposure processing is performed. Thereafter, the wafers are again transferred to unoccupied process units in third process block 12C in a prescribed order to be subjected to the developing processing. Before and after the coating and developing processing, heating and cooling processing is carried out in unoccupied process units. Here, delivery of the wafers between first process block 12A and second process block 12B, between second process block 12B and third process block 12C, and between third process block 12C and interface block 12D is carried out via delivery units of shelf units 16C, 16E and 16G, respectively.

Patent Document 1: Japanese Patent Laying-Open No. 2000-124124 (see FIG. 2)

DISCLOSURE OF THE INVENTION

Problems to be Solved by the Invention

In the above-described substrate processing apparatus, a series of processing are performed by first through third process blocks 12A-12C as a whole, and the process units to be used and the transfer order through the process units are predetermined in accordance with a process recipe for wafers W. Further, in this apparatus, it is extremely difficult to create a transfer program allowing the (n+1)-th wafer Wn+1 having been introduced into first through third process blocks 12A-12C following the n-th wafer Wn to outpace the relevant wafer Wn, such that the succeeding wafer Wn+1 is subjected to processing prior to the preceding wafer Wn. Such passing of wafer W cannot be effected.

Thus, in the current apparatus, assuming that wafer WA belonging to a group A for which processing takes a long time is discharged from carrier C to a process block and then wafer WB belonging to a group B for which processing time is shorter than the processing time of group A is discharged from carrier C to a process block, if wafers WB belonging to group B are successively discharged at the same timings as discharge of wafers WA belonging to group A, wafer WB would catch up with wafer WA, in which case wafer WB would be put on standby in the process block until completion of processing of wafer WA. To prevent wafer WB from being put on standby in the process block, upon discharge of wafer WB following wafer WA, it would be necessary to discharge wafer WB at a timing delayed from the discharge timing of wafer WA belonging to group A. Putting wafer WB on standby in the process block until it can be transferred to a unit for the next step, or delaying the discharge timing of wafer WB, would lead to an elongated total processing time, thereby degrading processing efficiency.

The present invention has been made in view of the foregoing circumstances, and an object of the present invention is to provide a substrate processing apparatus and a substrate processing method that can reduce the total processing time and improve the throughput by transferring a substrate on a first delivery stage to a process block where processing can be carried out earliest.

Means for Solving the Problems

To this end, the substrate processing apparatus of the present invention includes: a carrier block including a carrier placement portion to/from which a substrate carrier storing a plurality of substrates is loaded/unloaded, and first transfer means for performing delivery of the substrate with respect to the substrate carrier placed on the carrier placement portion; second transfer means provided adjacent to the carrier block and for transferring the substrate along a linear transfer path extending in a lateral direction; a first delivery stage for performing delivery of the substrate between the first transfer means and the second transfer means; a plurality of process blocks each including a plurality of process units for performing predetermined processing on the substrate, third transfer means for transferring the substrate between the process units, and a second delivery stage for performing delivery of the substrate between the second transfer means and the third transfer means, the process blocks being provided with respect to a main body of the apparatus to be arranged along the transfer path, and performing a series of substrate processing on the substrates in units of the process blocks; a process block control portion controlling operations of the third transfer means and the respective process units and outputting processing information of the substrates within the corresponding process block such that predetermined processing is performed on the substrates in each of the process blocks based on a predetermined recipe; and means for determining a process block where there is no substrate or where a final step for the last substrate within the relevant process block will be finished earliest based on the processing information of the substrates from the process block control portions before the substrate is delivered from the first delivery stage to the second transfer means, and for controlling the second transfer means to transfer the substrate on the first delivery stage to the relevant process block.

Here, with respect to lots of substrates allocated in accordance with the kinds of substrates, the means for controlling the second transfer means may determine, before a first substrate in a certain lot is delivered from the first delivery stage to the second transfer means, a process block where there is no substrate or where a final step for the last substrate in the preceding lot of substrates now being performed within the relevant process block will be finished earliest, and control the second transfer means to transfer the first substrate in the succeeding lot placed on the first delivery stage to the relevant process block.

In such a substrate processing apparatus, a substrate processing method as described in the following is performed. The substrate processing method is provided with first transfer means for performing delivery of a substrate with respect to a substrate carrier containing a plurality of substrates, second transfer means for performing delivery of the substrate with respect to the first transfer means via a first delivery stage, and a plurality of process blocks each including a plurality of process units for performing predetermined processing on the substrate, third transfer means for transferring the substrate between the process units, and a second delivery stage for performing delivery of the substrate between the second transfer means and the third transfer means, wherein a series of substrate processing are performed in the process blocks with respect to the substrates in the substrate carrier in units of the process blocks. The method includes the steps of: the first transfer means transferring the substrate within the substrate carrier to the first delivery stage; determining the process block where there is no substrate or where a final step for the last substrate within the relevant process block will be finished earliest, based on processing information of the substrates in the respective process blocks, before the second transfer means receives the substrate of the first delivery stage; and subsequently, the second transfer means receiving the substrate placed on the first delivery stage and transferring the relevant substrate to the determined process block.

In such a configuration, it is possible to transfer the substrate on the first delivery stage to the process block where processing can be carried out earliest. Accordingly, the total processing time can be reduced, and throughput can be improved.

Here, the substrate processing apparatus may be configured such that an interface portion to which a light exposure device is connected is connected to a side of the transfer path opposite to a side connected to the carrier block, or may be configured such that the interface portion to which the light exposure device is connected is connected to a side of the transfer path opposite to a side connected to the process blocks.

Further, the process block includes a coating unit for applying a resist solution to the substrate, a developing unit for performing developing processing on the substrate after exposure to light, a heating unit for heating the substrate, the third transfer means for transferring the substrate between the units, and the second delivery stage for performing delivery of the substrate between the second transfer means and the third transfer means, and such application of the resist solution and/or the developing processing after exposure to light is performed on the substrate in units of each process block. At this time, the process block control portion may be configured to further have a function to select the coating unit, the developing unit and the heating unit for use in the processing, based on the process recipe of the substrate.

Each process block may include a liquid process unit performing processing on the substrate using a chemical solution, a heating unit for heating the substrate, the third transfer means for transferring the substrate between the units, and the second delivery stage for performing delivery of the substrate between the second transfer means and the third transfer means, and it may be configured such that a series of processing are performed on the substrate in units of each process block. At this time, the process block control portion may be configured to further have a function to select the liquid process unit and the heating unit for use in the processing, based on the process recipe of the substrate.

Further, the liquid process unit may be for forming a coating film, or for coating the substrate with a chemical solution containing a precursor of an insulating film. Furthermore, the plurality of process blocks are formed to have the same size in two dimensions. The second transfer means is provided at a transfer block that extends along arrangement of the plurality of process blocks, and each process block is configured to be attachable to and detachable from the transfer block.

EFFECTS OF THE INVENTION

According to the substrate processing apparatus of the present invention, it is possible to reduce the total processing time and improve the throughput by transferring the substrate on the first delivery stage to the process block where processing can be carried out earliest.

DESCRIPTION OF THE REFERENCE SIGNS

B1: carrier block; B2: transfer block; B3: first process block; B4: second process block; B5: third process block; B6: interface portion; B7: light exposure device; C: substrate carrier; 22: first transfer means; 23: second transfer means; 24: first delivery stage; 31: third transfer means; 32: coating unit; 33: developing unit; 81: system control portion; 82A-82C: process block control portions; and 83: transfer block control portion.

BEST MODES FOR CARRYING OUT THE INVENTION

Figure 1:
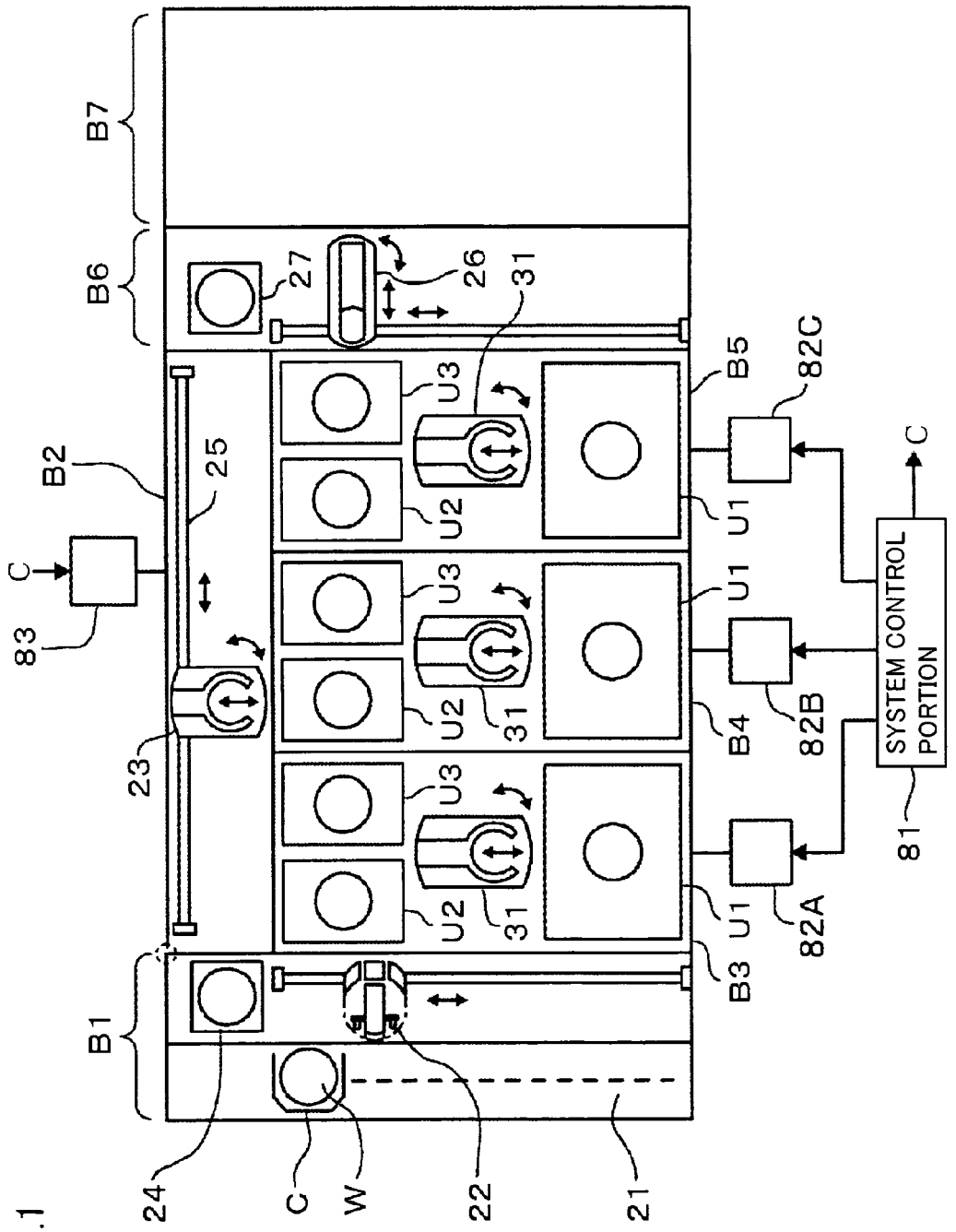
FIG. 1 is a top plan view showing a substrate processing apparatus according to an embodiment of the present invention.
Figure 2:
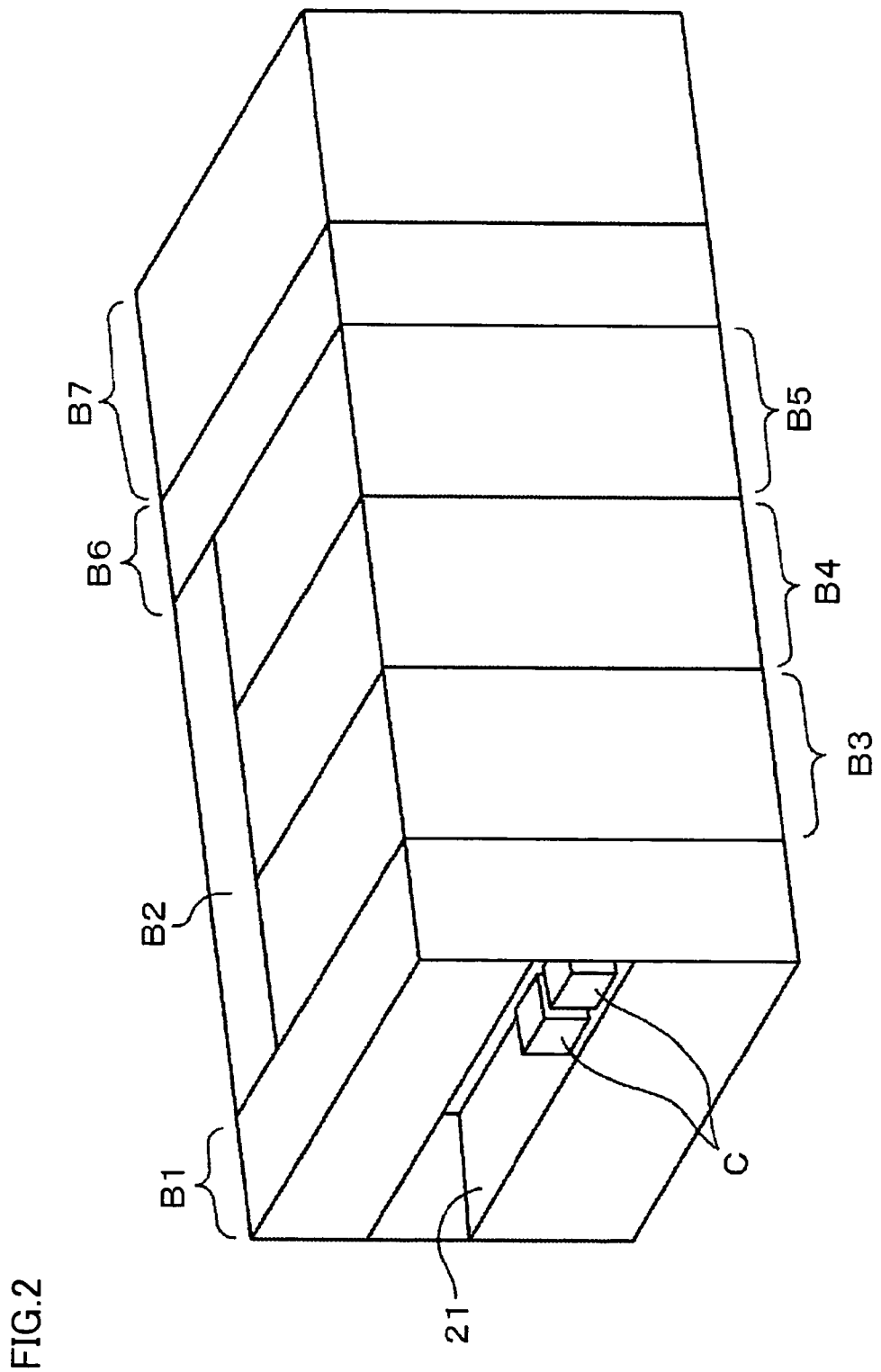
FIG. 2 is a perspective view showing the substrate processing apparatus according to the embodiment of the present invention.

Hereinafter, an embodiment of a substrate processing apparatus of the present invention will be described. FIG. 1 is a top plan view showing an overall configuration according to an embodiment of the substrate processing apparatus, and FIG. 2 is a schematic perspective view thereof In the figures, B1 is a carrier block for loading/unloading a substrate carrier C containing, e.g., 25 substrates, such as semiconductor wafers W. Carrier block B1 includes a carrier placement portion 21 for placement of substrate carrier C, and first transfer means 22.

On one side of carrier block B1, for example on the left end side as seen from the carrier placement portion 21 side, a transfer block B2 having a transfer path linearly extending in the lateral direction, i.e., the direction approximately orthogonal to the arrangement direction of carriers C, is provided to be connected to carrier block B1. First transfer means 22 of carrier block B1 is configured to be movable left and right, back and forth, up and down and also rotatable about a vertical axis so as to take out wafer W from substrate carrier C and deliver the relevant wafer W to second transfer means 23 of transfer block B2.

Here, a first delivery stage 24 is provided at carrier block B1 in the vicinity of the region connected to transfer block B2, for delivering wafer W between first transfer means 22 of carrier block B1 and second transfer means 23 of transfer block B2. This delivery stage 24 is configured, e.g., in two stages of: a delivery stage for loading, for use in loading wafer W to transfer block B2; and a delivery stage for unloading, for use in unloading wafer W from transfer block B2. It is noted that delivery stage 24 may be provided in transfer block B2 in a region accessible by first transfer means 22. Alternatively, it may be configured in one stage so that a common delivery stage can be used for loading/unloading wafer W with respect to transfer block B2. For example, the delivery stage has a structure capable of supporting three substrates at the back surfaces, and is configured not to interfere with the respective arms of first and second transfer means 22 and 23.

Transfer block B2 is provided with a guide rail 25 that constitutes the transfer path linearly extending in the lateral direction. Second transfer means 23 is provided with two arms for holding the wafers, for example, and is configured to be movable in the lateral direction along guide rail 25, movable up and down, movable back and forth, and rotatable about a vertical axis. It is noted that transfer means 23 may have a single arm.

Further, a plurality of, e.g., three process blocks B3, B4, B5 are provided in a freely attachable/detachable manner with respect to transfer block B2 constituting the main body of the apparatus, which are arranged along the transfer path of transfer block B2. In this example, first through third process blocks B3-B5 are identical to each other in configuration, with their parts arranged in identical layout. That is, process blocks B3-B5 are formed to have the same size, and the equal numbers of identical types of process units are arranged in process blocks B3-B5 in the same layout.

Figure 3:
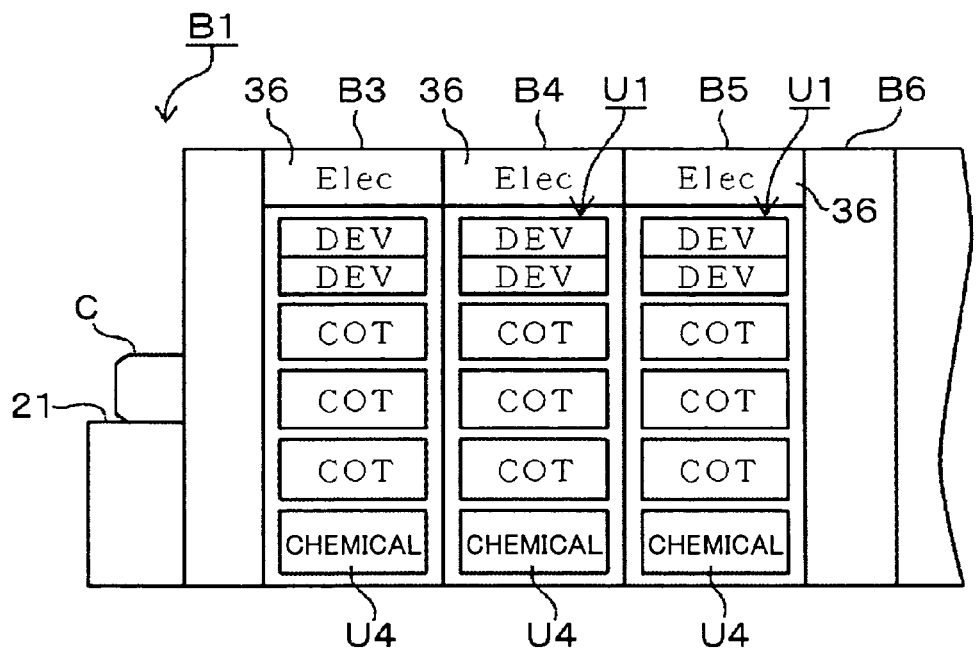
FIG. 3 is a side cross sectional view of the substrate processing apparatus.
Figure 4:
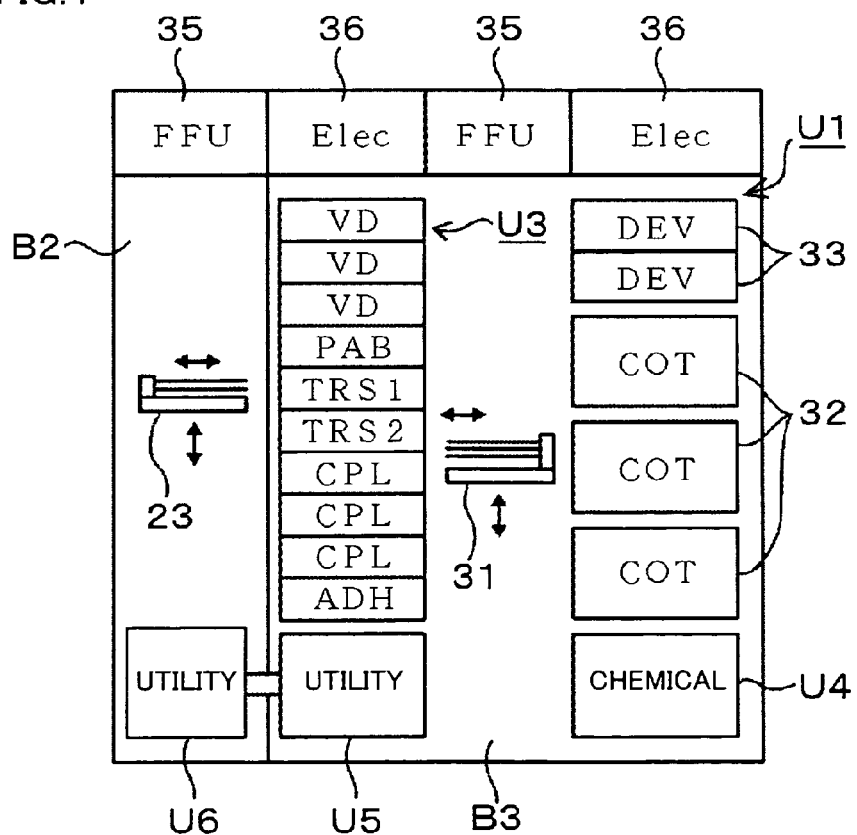
FIG. 4 is a side cross sectional view of the substrate processing apparatus.
Figure 5:
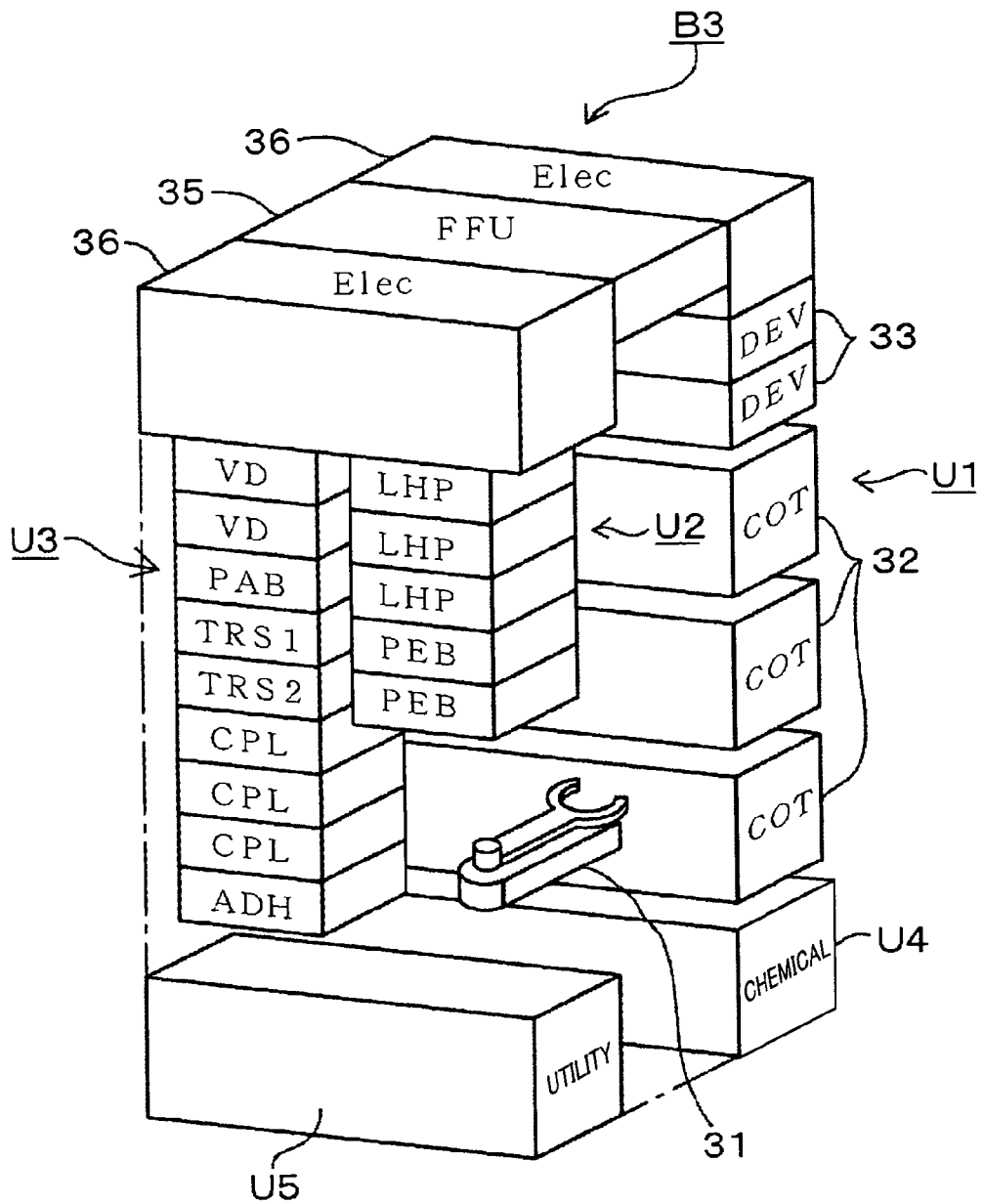
FIG. 5 is a perspective view showing the interior of the process block of the substrate processing apparatus.

Specifically, taking first process block B3 as a representative and referring also to FIGS. 3-5, third transfer means 31 is provided at the center of process block B3, and to surround the same, for example, a liquid process unit group U1 having for example three coating-related units (COT) 32 and two developing units (DEV) 33 stacked in multiple stages, e.g., in five stages, is arranged to the right as seen from carrier block B1 to the back, and shelf units U2 and U3 having multiple stages, e.g., six stages and ten stages, respectively, of units related to heating/cooling or the like, are arranged on the front side and the back side, respectively, to the left.

Coating-related unit 32 and developing unit 33 each constitute the liquid process unit. Coating-related unit 32 may include, for example, a coating unit for performing processing of coating wafer W with a resist solution, and an anti-reflection coating forming unit for forming a lower-layer anti-reflection coating or an upper-layer anti-reflection coating by applying a chemical solution for formation of anti-reflection coating to the wafer surface before or after application of the resist solution. Developing unit 33 is a unit for performing developing processing by, e.g., forming a puddle of a developing solution on the substrate after exposure to light and keeping the same in that state for a prescribed period of time.

Shelf units U2, U3 are each configured by stacking a plurality of units at the region accessible by second transfer means 23 of transfer block B2. In this example, there are provided for example three vacuum drying units (VD) for removing solvent included in the coating solution after the liquid processing performed at the coating unit, the anti-reflection coating forming unit and the like, for example four heating units (LHP) for use in prescribed heating processing of wafer W before coating with the resist solution or for use in heating processing after development, for example one heating unit (PAB), called a pre-baking unit or the like, for performing heating processing on the wafer after coating with the resist solution, for example two heating units (PEB), called a post-exposure baking unit or the like, for performing heating processing on the wafer W after exposure to light, for example three temperature regulating units (CPL) that are units for adjusting wafer W to a prescribed temperature, a hydrophobic process unit (ADH) for performing hydrophobic processing on the wafer surface, and additionally, for example one delivery unit (TRS1) for loading wafer W to process block B3, and for example one delivery unit (TRS2) for unloading wafer W from process block B3, which are allocated in a vertical direction.

Delivery units TRS1, TRS2 correspond to the second delivery stage of the present invention. Although FIGS. 3-5 show an example of the layout of these units, the number and the types of the units are not limited thereto, and in this example as well, it may be configured to have a single delivery unit to be used for both loading of wafer W to process block B3 and unloading of wafer W from process block B3. Further, the delivery unit (TRS2) may be added with a temperature regulating function for the purpose of lowering the temperature of the wafer, and it may be configured such that this temperature regulating function is used to lower the temperature of wafer W when delivering the same after the processing in the heating unit (PAB), or after the heating processing following the developing processing, for example.

Third transfer means 31 is configured to be movable up and down, back and forth, and also rotatable about a vertical axis, as will be described later, and is responsible for transferring wafer W between liquid process unit group U1 and shelf units U2, U3. It is noted that second transfer means 23 is not shown in FIG. 2 for the sake of convenience. Second transfer means 23 is configured as described above, so as to deliver wafer W received from first transfer means 22 to delivery unit TRS1 (TRS2) of process block B3.

Further, in this example, at each of the upper side of transfer block B2 and the upper side of the region of process block B3 where third transfer means 31 is provided, a fan filter unit (FFU) 35 formed with a fan having rotary blades and a ULPA filter or a chemical filter is provided. The cleaned air having particles and ammonia components removed by fan filter unit 35 is supplied to the lower side of transfer block B2 and to the lower side of the region where third transfer means 31 is provided. Further, at each of the upper side of the region in process block B3 where shelf units U2, U3 are provided, and the upper side of the region in process block B3 where liquid process unit group U1 is provided, an electric equipment storing portion 36 is provided, in which a driver connected to a motor of transfer means or the like, an I/O board connected to each unit, and a control portion for controlling each unit are stored.

A chemical unit U4 storing tanks of chemical solutions such as a developing solution and a coating solution including an anti-reflection coating forming solution, a liquid for temperature regulation, a developing solution, inactive gas and others, is provided near the floor surface on the lower side of liquid process unit group U1, and near the floor surface on the lower side of shelf units U2, U3, a first utility unit U5 containing a plurality of utility lines for taking in utilities from the outside is provided. Meanwhile, transfer block B2 is provided with a second utility unit U6 of the external side, corresponding to first utility unit U5. It is configured such that first and second utility units U5, U6 are connected to each other when process block B3 is pressed to the transfer block B2 side.

The side of third process block B5 opposite to the first process block B3 side is connected via an interface portion B6 to a light exposure device B7. Further, interface portion B6 is set to be connected to the side of transfer block B2 opposite to the side connected to carrier block B1. Interface portion B6 is provided with delivery means 26, which is configured to be movable up and down, left and right, back and forth, and also rotatable about a vertical axis, for example, so as to deliver wafer W between second transfer means 23 of transfer block B2 and light exposure device B7. Here, at interface portion B6, in the vicinity of the region connected to transfer block B2, a delivery stage 27 formed in two stages for example is provided for delivering wafer W between delivery means 26 of interface portion B6 and transfer means 23 of transfer block B2. Delivery stage 27 may be provided in transfer block B2 in the region accessible by second transfer means 23 and by delivery means 26 of interface portion B6, or it may be provided with a temperature regulating mechanism for keeping the substrate temperature uniform. Further, it may be configured with one stage or more than one stage.

Hereinafter, configurations of coating-related unit 32, the heating unit (PEB) and others provided at process blocks B3-B5 will be described in brief. Firstly, coating-related unit 32 such as the coating unit or the anti-reflection coating forming unit is described with reference to FIG. 6. Although the coating-related unit used may have a configuration of a spin coating type where a processing solution is supplied onto the substrate and spread by rotation as will be described later, herein, a scanning coating device is described by way of example.

Wafer W is partially notched at its peripheral portion to provide a notch N indicating the direction of wafer W. In the figure, 51 represents a substrate holding portion, which is configured with an attraction portion 51a that attracts the back surface side of wafer W to hold it approximately horizontally, and a drive base body 52, movable in the X direction, that causes attraction portion 51a to be movable up and down and rotatable about a vertical axis. Drive base body 52 has its bottom end supported by a movable body 53.

A ball screw portion 54 is provided near the bottom surface of movable body 53, which portion is driven by a motor M1. When ball screw portion 54 is rotated by motor M1, movable body 53 is guided by a rail not shown, to move in the Y direction in the figure. Further, a rail not shown is provided on the upper surface of movable body 53 to guide drive base body 52 in the X direction. With the operations of drive base body 52 and movable body 53, wafer W held by substrate holding portion 51 is movable to any position in the X and Y directions, respectively. By means of movable body 53, the rails not shown, ball screw portion 54 and motor M1, wafer W is moved back and forth relative to a coating solution nozzle 55 provided on the upper side of wafer W for applying the coating solution such as the resist solution or the chemical solution for the anti-reflection coating. That is, wafer W is moved in the Y axis direction in FIG. 6.

Coating solution nozzle 55 is configured to be movable in the X direction by means of a drive base body 56 of a rectangular shape extending in the X direction, which contains therein a drive pulley, a driven pulley, an endless belt wound around the pulleys, which are not shown, and a motor M2 for rotating the drive pulley. In the FIG. 57 (57a, 57b) represents a pair of liquid receiving portions for receiving the coating solution dropping from the above to prevent the coating solution from being fed to the region of wafer W near the outer periphery.

In this coating-related unit 32, when coating solution nozzle 55 moves from one end face to the other end face of the wafer, wafer W is moved intermittently, at the corresponding timing, in the direction crossing the same. With repetition of such an operation, the coating solution is applied onto wafer W as if drawing a picture without lifting the pencil from the paper.

The vacuum drying unit (VD), which is the process unit for use in the step following that of coating-related unit 32, is configured to heat wafer W to a prescribed temperature while reducing the pressure to a prescribed degree of vacuum in a sealed vessel, for example, to vaporize a solvent within the coating film to thereby form the coating film. Further, developing unit 33 is configured to supply a developing solution from the supply nozzle to the central portion of wafer W along the width in the radial direction of wafer W, to cause wafer W to half turn to create a puddle of the developing solution on wafer W, and to carry out prescribed developing processing by leaving wafer W with the puddle of the developing solution thereon for a prescribed period of time.

Figure 7:
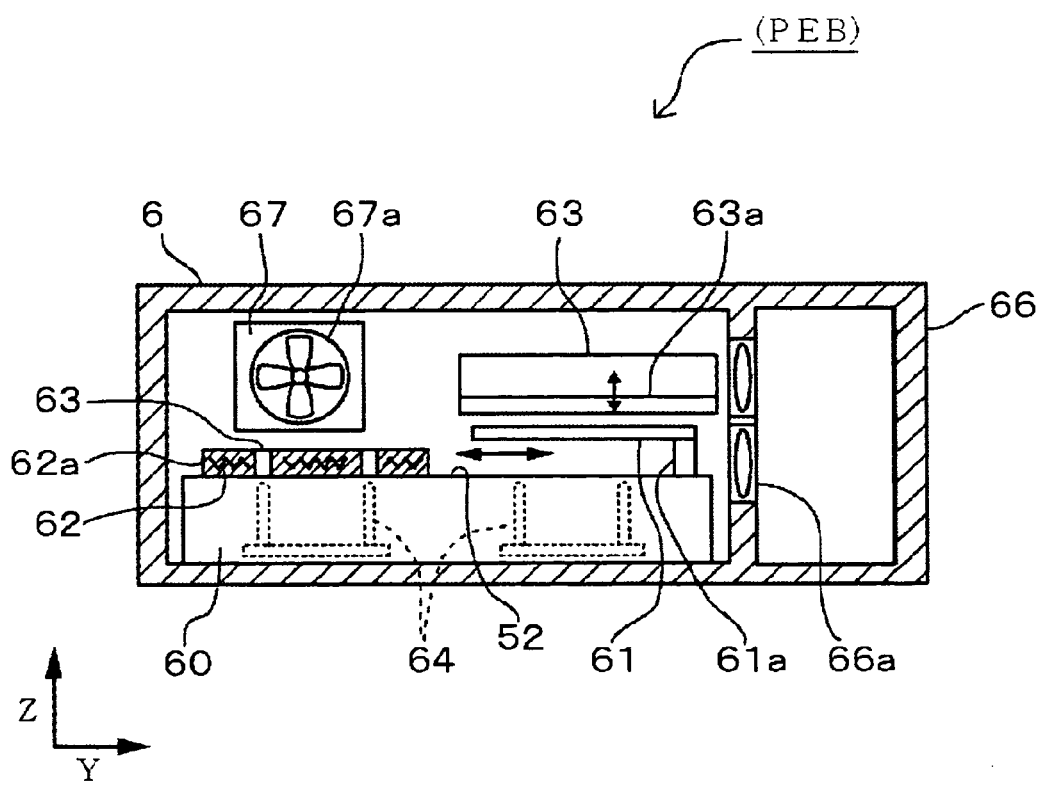
FIG. 7 is a cross sectional view of a heating unit (PEB) provided in the substrate processing apparatus.

A post exposure baking unit (PEB) serving as the heating unit will now be described with reference to FIG. 7. In a casing 6, on an upper surface of a stage 60, a cooling plate 61 is arranged on the front side, and a heating plate 62 provided with a heater 62a is arranged on the back side. Cooling plate 61 is used to deliver wafer W between heating plate 62 and third transfer means 31 that advances into casing 6 via an opening portion 63 provided with a shutter 63a, and also functions to cool the heated wafer W to some extent (rough heat removal) at the time of transfer. Thus, as shown in the figure, a leg portion 61a is configured to be movable back and forth in the Y direction along guide means not shown, so that cooling plate 61 can move from the position on the side of opening portion 63 to the position above heating plate 62. Further, a cooling flow channel not shown is provided on the rear surface side of cooling plate 61.

In stage 60, at the delivery position of wafer W between third transfer means 31 and cooling plate 61, and at the delivery position of wafer W between heating plate 62 and cooling plate 61, support pins 64 are provided, which protrude and retreat freely. Cooling plate 61 is provided with slits not shown, to allow raised support pins 64 to penetrate through cooling plate 61 to lift wafer W. In the figure, 66 represents a ventilation room in communication via a fan 66a, and 67 represents a ventilation hole provided with a fan 67a.

In such a heating unit (PEB), wafer W is delivered from third transfer means 31 onto cooling plate 61, and then delivered by cooling plate 61 onto heating plate 62, where prescribed heating processing is carried out. The wafer having undergone the heating processing is returned from heating plate 62 to cooling plate 61, where it is cooled to some extent, and then received by the third transfer means to be transferred to the next step.

The heating units (LHP), (PAB) each have a configuration provided with only a heating plate for heating wafer W to a prescribed temperature, and temperature regulating unit (CPL) has a configuration provided with only a cooling plate for adjusting wafer W to a prescribed temperature.

Figure 8:
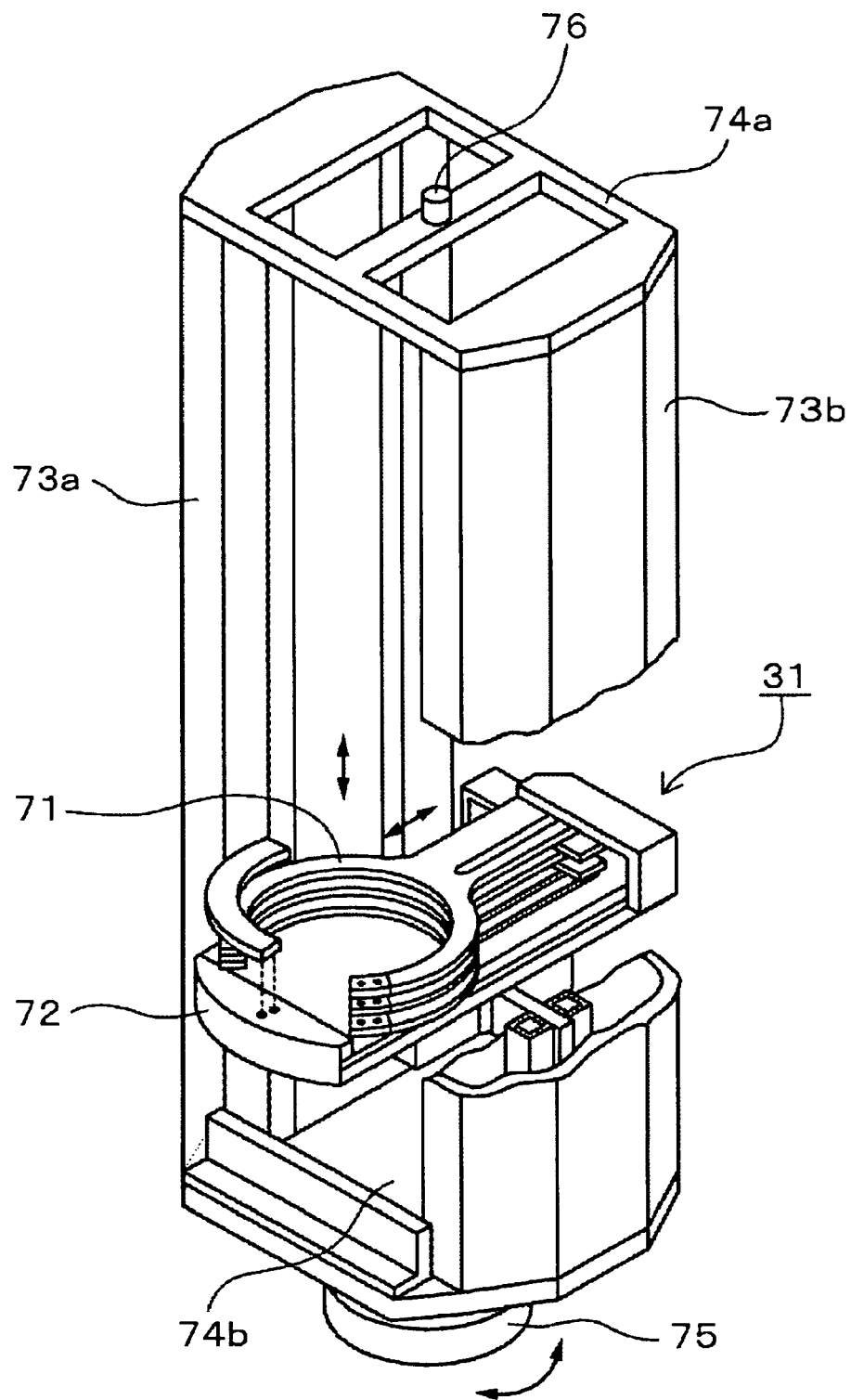
FIG. 8 is a perspective view of third transfer means provided in the substrate processing apparatus.

Third transfer means 31 will now be described with reference to FIG. 8. This transfer means 31 is provided with for example three arms 71 for holding wafers W, a base table 72 supporting arms 71 to be freely movable back and forth, a pair of guiding rails 73a, 73b supporting base table 72 to be freely movable up and down, connecting members 74a, 74b respectively connecting the upper ends and lower ends of guiding rails 73a, 73b, a rotation drive portion 75 integrally attached to connecting member 74b at the lower ends of the guiding rails so as to drive a frame body made of guiding rails 73a, 73b and connecting members 74a, 74b in a manner rotatable about a vertical axis, and a rotation shaft portion 76 provided at connecting member 74a at the upper ends of the guiding rails.

Arm 71 is configured with three stages so as to respectively hold wafers W, and has its proximal end portion movable in a sliding manner along the longitudinal direction of the base table. Such back and forth movement of arm 71 by sliding is controlled by drive means not shown. Further, the up and down movement of base table 72 is controlled by another drive means not shown. In this manner, arm 71 is driven to be rotatable about the vertical axis as well as movable up and down and back and forth.

Figure 9:
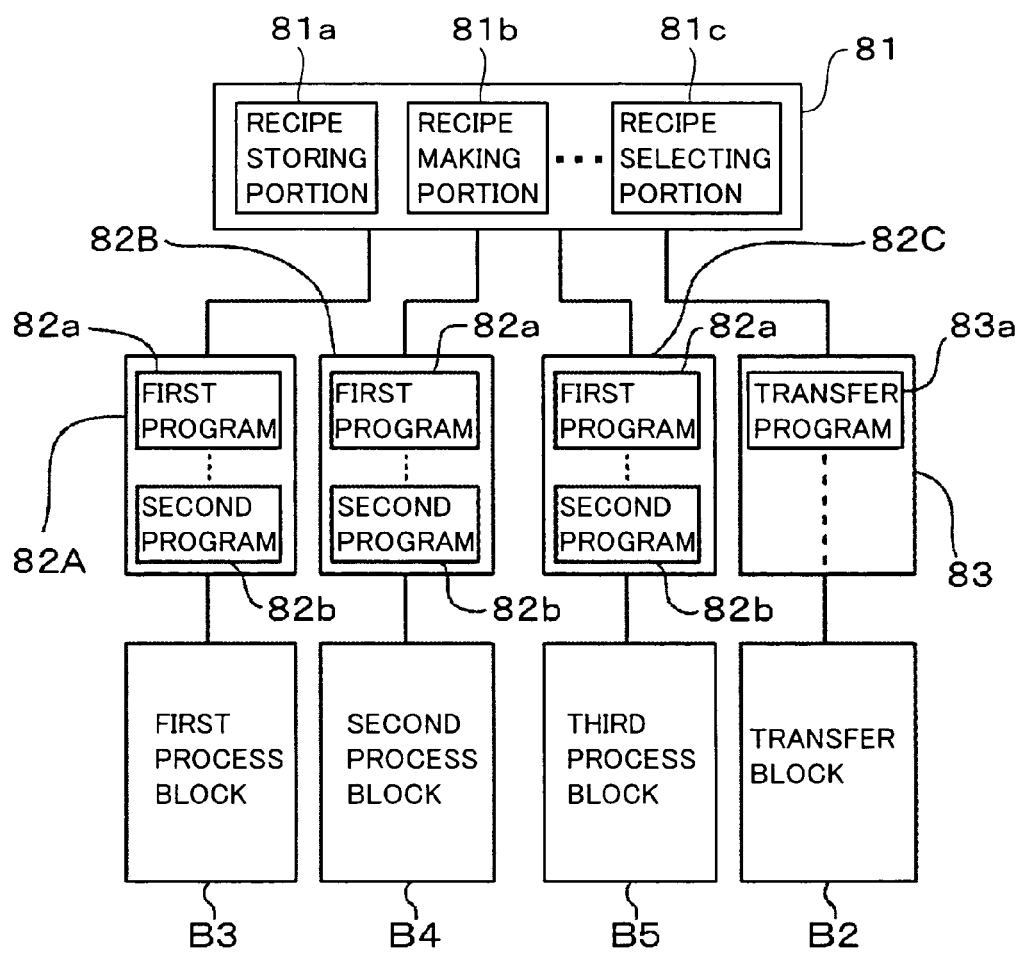
FIG. 9 is a block diagram illustrating a control system of the substrate processing apparatus of the present invention.

In such a substrate processing apparatus, as shown in FIGS. 1 and 9, the entire apparatus is controlled by a system control portion 81, and process blocks B3-B5 are controlled by process block control portions 82 (82A-82C), respectively, based on instructions from system control portion 81. Transfer block B2 is controlled by a transfer block control portion 83, based on an instruction from system control portion 81. System control portion 81 includes a recipe storing portion 81a that stores a recipe of processing carried out in process blocks B3-B5 for each substrate contained in a substrate carrier, for example, a recipe making portion 81b that modifies or edits the recipe, and a recipe selecting portion 81c that selects a prescribed recipe from among the plurality of recipes stored in the recipe storing portion.

Process block control portion 82A (82B, 82C) includes a first program 82a that controls process unit B3 (B4, B5), based on a prescribed recipe transmitted from system control unit 81, to select a process unit required for the processing of the relevant recipe, and to perform the processing under predetermined process conditions, and a second program 82b that keeps track of the processed state of the wafer inside process block B3 (B4, B5) for output to system control portion 81. As such, in process block control portion 82A (82B, 82C), the processed state of the wafer within process block B3 (B4, B5) is recognized in real time and informed to system control portion 81. Thus, in system control portion 81, it is possible to understand in which process unit the last wafer W is being processed in each of process blocks B3-B5, and which one of process blocks B3-B5 can finish processing of wafer W earliest in the process unit in the final process step.

Transfer block control portion 83 includes control means for controlling the second transfer means, and stores a transfer program 83a for transferring wafer W delivered by second transfer means 23 between first delivery stage 24 and delivery units TRS1, TRS2 of prescribed process blocks B3-B5 and delivery stage 27 of interface portion B6, based on instructions from system control portion 81.

The flow of the wafers in such a substrate processing apparatus will now be described in brief. An automatic transfer robot (or an operator) loads carrier C storing 25 wafers W, for example, from the outside onto carrier placement portion 21 of carrier block B1. Next, first transfer means 22 takes out wafer W from within carrier C and delivers the same to delivery stage 24 of carrier block B1. Wafer W on delivery stage 24 is delivered by second transfer means 23 of transfer block B2 to a predetermined process block, e.g., first process block B3, via delivery unit TRS1 for use in input of the relevant process block B3. In process block B3, third transfer means 31 transfers the wafer to prescribed process units successively, to perform, e.g., the resist solution coating process in this example in units of the block.

Wafer W coated with the resist solution is delivered to second transfer means 23 of transfer block B2 via delivery unit TRS2 for use in output, and transferred to delivery stage 27 of interface portion B6. Thereafter, wafer W is transferred by delivery means 26 of interface portion B6 to light exposure device B7, where prescribed light exposure processing is carried out.

Wafer W having been exposed to light is transferred via delivery means 26 of interface portion B6, delivery stage 27, and second transfer means 23 of transfer block B2, back to the original process block where the resist solution was applied, i.e., to first process block B3 via delivery unit TRS1 for use in input provided at process block B3. It is then transferred by third transfer means 31 to a predetermined process unit, where prescribed developing processing, for example, is carried out. Thereafter, it is delivered to second transfer means 23 of transfer block B2 via delivery unit TRS2 for use in output. It is then returned to original carrier C, for example, via delivery stage 24 of carrier block B1 and first transfer means 22. Thus, in this example, formation of coating film of one kind is carried out in units of blocks in first through third process blocks B3-B5, and formation of the coating film is completed in the respective process blocks B3-B5.

Figure 10:
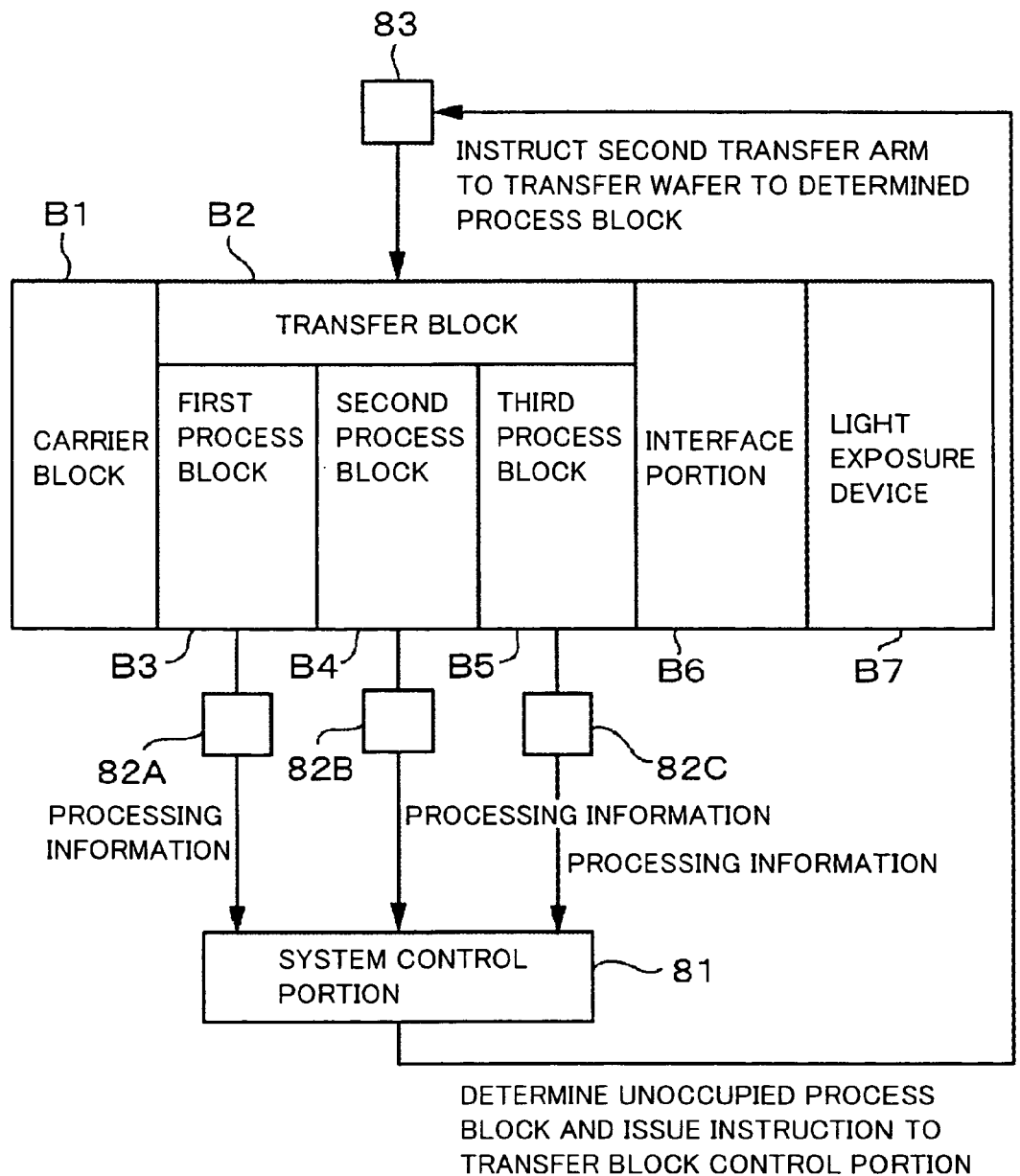
FIG. 10 is a top plan view illustrating functions of the substrate processing apparatus of the present invention.

A characteristic configuration of the present invention will now be described with reference to FIG. 10. Here, the case of transferring the substrates in a plurality of substrate lots allocated in accordance with the kinds of the wafers will be explained, assuming that two wafers WA of the kind A are stored in first process block B3, two wafers WB of the kind B are stored in second process block B4, two wafers WC of the kind C are stored in third process block B5, and a wafer WD of the kind D is supposed to be discharged from carrier C. It is noted that a plurality of lots may be allocated in the same substrate carrier, as in the case where wafers to be subjected to different kinds of processing are contained in the same substrate carrier C, or the respective lots may be allocated in different substrate carriers C.

Process block control portions 82A-82C of respective process blocks B3-B5 keep track of the processed states of wafers WA-WC in the respective blocks B3-B5, and send the information to system control portion 81 in real time. As such, system control portion 81 recognizes how far the processing has proceeded for the last wafers WA-WC, via process block control portions 82A-82C.

Meanwhile, the first wafer WD of the succeeding lot is discharged from carrier C by first transfer means 22 and transferred to first delivery stage 24. Second transfer means 23 of transfer block B2 is driven based on a transfer program of transfer block control portion 83. When it is about to pick up wafer WD on delivery stage 24 at a timing determined by the transfer program, it makes an inquiry to system control portion 81 as to which process block B3-B5 the wafer should be transferred.

System control portion 81 determines unoccupied states of process blocks B3-B5 and issues an instruction to transfer block control portion 83 to transfer wafer WD to process block B3-B5 determined to be unoccupied. Herein, the unoccupied process block B3-B5 not only refers to the process block B3-B5 where the last wafer W of the preceding substrate lot does not exist, but also refers to the process block B3-B5 where the final process step for the last wafer W in the relevant process block B3-B5 will be finished earliest.

In this manner, process block B3-B5 in which the processing of the wafers within process block B3-B5 will be finished earliest is determined based on the processing information of wafers WA-WC in the respective process blocks B3-B5, before the first wafer WD of the succeeding lot is delivered from first delivery stage 24 to second transfer means 23. This information is sent to transfer block control portion 83, and wafer WD is transferred to the determined process block B3-B5 by second transfer means 23. Here, for wafer WD, a recipe of the processing to be performed on the relevant wafer WD is stored in system control portion 81, and once the process block B3 (B4, B5) to which wafer WD is to be transferred is determined, the process recipe of the relevant wafer WD is transmitted from system control portion 81 to process block control portion 82A (82B, 82C) of the relevant process block B3 (B4, B5). In the process block B3 (B4, B5), the process units to be used are selected based on the process recipe, and processing is performed in each of the process units under predetermined processing conditions.

Wafer W following the relevant wafer WD is transferred to predetermined process block B3-B5 in a similar manner, to be subjected to predetermined processing. Although the case of transferring a first wafer in a different lot has been described here by way of example, in the case of transferring a wafer of the same lot as well, process block B3-B5 is selected in a similar manner for performing predetermined processing.

Hereinafter, a specific example of wafer processing carried out in each process block B3-B5 will be described, assuming that wafer WA to be subjected to first processing, wafer WB to be subjected to second processing, and wafer WC to be subjected to third processing are stored in the same substrate carrier C, for example. In this example, the first processing refers to formation of anti-reflection coatings on a lower-layer side and an upper-layer side, respectively, of a resist film with respect to the wafer, the second processing refers to formation of an anti-reflection coating on an upper-layer side of a resist film with respect to the wafer, and the third processing refers to formation of an anti-reflection coating on a lower-layer side of a resist film with respect to the wafer.

In the case where the wafer within carrier C is wafer WA to be subjected to the first processing, when the process block to which the relevant wafer WA is to be transferred is determined to be first process block B3, for example, the process recipe of wafer WA is transmitted from system control portion 81 to process block control portion 82A of the relevant process block B3. As described above, in process block control portion 82A, the process units for use are selected based on the process recipe, and processing is performed in each of the process units under predetermined processing conditions. More specifically, in the first processing, wafer WA firstly carried in via delivery unit TRS1 is transferred in the order of a temperature regulating unit (CPL)→a coating-related unit (COT) for formation of the anti-reflection coating on the lower-layer side→heating unit (LHP) or a vacuum drying unit (VD)→temperature regulating unit (CPL)→coating unit (COT)→heating unit (PAB) or vacuum drying unit (VD)→temperature regulating unit (CPL)→an upper-layer anti-reflection coating forming unit (COT)→heating unit (LHP) or vacuum drying unit (VD), during which the anti-reflection coating on the lower-layer side (Bottom-ARC), the film of the resist solution, and the anti-reflection coating on the upper-layer side (Top-ARC) are formed in this order from the lower side, and then carried out via delivery unit TRS2 to be subjected to light exposure processing at light exposure device B7. Here, the next step of that of coating-related unit (COT) may be performed using either heating unit (LHP, PAB) of hot plate type or vacuum drying unit (VD).

Next, wafer WA having been exposed to light is transferred through the above-described path to the original process block B3 where the resist solution was applied, via a delivery unit TRS1 for use in input of the relevant process block. It is transferred through heating unit (PEB)→temperature regulating unit (CPL)→developing unit (DEV), where predetermined developing processing is performed. It is then adjusted to a predetermined temperature in heating unit (LHP), and carried out via delivery unit TRS2. The first processing for forming the lower-layer anti-reflection coating, the resist film and the upper-layer anti-reflection coating is carried out in this manner. Thus, in the process block to which wafer WA to be subjected to the first processing is transferred, the above-described process units are selected, and predetermined processing is carried out in each process unit.

In the case where the wafer within carrier C is wafer WB to be subjected to the second processing, when the process block to which the relevant wafer WB is to be transferred is determined to be second process block B4, for example, a process recipe of wafer WB is transmitted from system control portion 81 to process block control portion 82B of this process block B4. In process block control portion 82B, the process units for use are selected based on the process recipe, as described above, and processing is carried out under predetermined processing conditions in each of the process units. More specifically, in the second processing, the wafer is transferred in the order of a hydrophobic process unit (ADH) →temperature regulating unit (CPL) →coating unit (COT) →vacuum drying unit (VD) to perform coating processing of a resist solution, and then transferred in the order of heating unit (PAB)→temperature regulating unit (CPL)→upper-layer anti-reflection coating forming unit (COT) →vacuum drying unit (VD)→heating unit (LHP), to form the upper-layer anti-reflection coating (Top-ARC). Thereafter, it is transferred to light exposure device B7, as described above, where predetermined light exposure processing is carried out.

Next, wafer WB having been exposed to light is transferred to process block B4 where application of the resist solution and formation of the upper-layer anti-reflection coating were conducted, through the above-described path. Predetermined developing processing is conducted in a similar manner as in the first processing above, and thus, the resist film and the upper-layer anti-reflection coating are formed. As such, in the process block to which wafer WB to be subjected to the second processing is transferred, the above-described process units are selected, and predetermined processing is carried out in each of the process units.

Further, in the case where the wafer within carrier C is wafer WC to be subjected to the third processing, when the process block to which wafer WC is to be transferred is determined to be third process block B5, for example, a process recipe of wafer WC is transmitted from system control portion 81 to process block control portion 82C of this process block B5. In process block control portion 82C, the process units for use are selected based on this process recipe, and processing is carried out in each of the process units under prescribed processing conditions. More specifically, in the third processing, the wafer is transferred in the order of temperature regulating unit (CPL)→lower-layer anti-reflection coating forming unit (COT) →vacuum drying unit (VD) →heating unit (LHP), for example, to form the lower-layer anti-reflection coating, and then transferred in the order of temperature regulating unit (CPL)→coating unit (COT) →vacuum drying unit (VD)→heating unit (PAB), to conduct the coating processing of the resist solution. Thereafter, it is transferred to light exposure device B7, as described above, to be subjected to predetermined light exposure processing.

Next, wafer WC having been exposed to light is transferred to process block B5 where application of the resist solution and formation of the lower-layer anti-reflection coating were performed, through the path similar to those in the first and second processing described above, to be subjected to predetermined developing processing. The lower-layer anti-reflection coating and the resist film are formed in this manner. As such, in process block B5 to which wafer WC to be subjected to the third processing is transferred, the above-described process units are selected, and predetermined processing is carried out in each of the process units.

As described above, in the present embodiment, different kinds of processing are performed in the respective process blocks B3-B5. It is noted that two different recipes would not be carried out simultaneously within one process block. Rather, one kind of processing is carried out only after the other kind of processing is finished.

In this configuration, transfer block B2 is provided, and second transfer means 23 of the relevant transfer block B2 performs delivery of wafers W between carrier block B1 and respective process blocks B3-B5, and between respective process blocks B3-B5 and interface portion B6. Further, in the respective process blocks B3-B5, parallel processing is carried out for each block. This means that third transfer means 31 of each process block B3-B5 only needs to take charge of transfer of wafer W within the relevant process block B3-B5, so that the burden of transfer means 31 is alleviated compared to the conventional case. As such, it is less probable that transfer of processed wafer W by transfer means 31 is awaited, which leads to reduction in transfer time and, hence, improvement in throughput when seen as the entire apparatus.

Further, each process block B3-B5 is configured to be freely attachable to and detachable from transfer block B2 (main body of the apparatus), and a series of processing of different kinds are completed in units of the process blocks. Thus, for example in the case of increasing the kind of processing, it can be addressed by adding a process block corresponding to that new kind of processing, ensuring a large degree of freedom in processing carried out in the apparatus. As such, it is applicable to production in small amount for various kinds, as in the case where wafers to be subjected to different kinds of processing are mounted in the same carrier C, as described in the above embodiment.

Furthermore, in each of the first through third process blocks B3-B5, a series of processing are carried out independently for each block. Further, when wafer W is discharged from substrate carrier C onto first delivery stage 24 and second transfer means 23 of transfer block B2 is to pick up this wafer W, the processed states of wafers W within first through third process blocks B3-B5 are confirmed, and the process block where there is no wafer W or the processing will be finished earliest is checked, and second transfer means 32 is controlled to transfer wafer W to the relevant process block. This enables smooth transfer of wafer W from first delivery stage 24 to the process block.

That is, in the conventional case, when there is more than one process block, a series of processing are carried out by all the process blocks as a whole. This poses the problem, as described in the background art section, that when wafer WB requiring short processing time is discharged after wafer WA requiring long processing time, wafer WB would catch up with wafer WA in a certain step, hindering smooth transfer of wafer WB, which leads to degradation of throughput. In contrast, with the configuration of the present invention, a series of processing are carried out independently in each of the process blocks, and the processed state of the last wafer W in each process block varies depending on the timing of transferring wafer W to the process block, or the kind of the processing. Accordingly, it is configured such that the processed states of wafers W in the respective process blocks are kept track, and the process block to which newly discharged wafer W is to be transferred is determined in accordance with the unoccupied state(s) of the process block(s) at the timing of transferring the relevant wafer W. This can shorten the standby time of wafer W on first delivery stage 24 to the greatest extent, whereby smooth transfer of wafer W to the process block is ensured. Accordingly, the total transfer time is reduced, and throughput for the entire processing is increased.

At this time, in the case of production of various kinds with small quantities, such as when wafers to be subjected to different kinds of processing are stored in a substrate carrier C, and in the case where wafer WA belonging to the first group of kind of processing is discharged before discharge of wafer WB belonging to the second group of kind of processing for which the processing time is shorter than that of the first kind of processing, the destination of the wafer is determined based on the states of the process blocks that are known in advance. This can suppress occurrence of the state where succeeding wafer WB catches up with preceding wafer WA during the processing, causing wafer WB to be awaited to be transferred to the next step. Thus, degradation in throughput can be suppressed advantageously.

Further, the process units of the numbers corresponding to the preset processing are prepared in each process block, including coating-related unit 32, developing unit 33, vacuum drying unit (VD), heating unit (PEB, PAB, LHP), hydrophobic process unit (ADH), temperature regulating unit (CPL) or the like, and, in accordance with a process recipe of wafers transferred to the relevant process block, process block control portion 82 selects coating-related unit 32, developing unit 33, heating unit and other processing units corresponding to the relevant recipe, and sets the processing conditions to perform predetermined processing. In this manner, different kinds of processing can be performed by one process block, whereby the degree of freedom in processing performed by the apparatus can be increased.

Further, it is configured such that the process units in the process block are combined freely to perform processing, as described above, so that system control portion 81 as well as process block control portions 82A-82C can store a program with which in the event that there is a trouble such as breakdown of a process unit within a process block, the wafer is transferred to another process unit. In doing so, it becomes unnecessary to immediately stop the processing upon occurrence of such a trouble to check or exchange the relevant process unit in trouble, whereby degradation in throughput can be suppressed.

Still further, in this example, creation of the process recipe and transfer recipe of wafers can be simplified. That is, in the conventional apparatus, the process recipe of the wafers would designate not only the process flow, but also the process units themselves to be used therein, as described above. In contrast, with the method of the present invention, the process recipe of wafers W managed by system control portion 81 designates the process flow alone. It is only necessary to determine the process unit to be used before second transfer means 23 receives wafer W on first delivery stage 24. It is thus unnecessary to designate the process unit to be used in the process recipe, whereby creation of the process recipe and the transfer recipe is simplified.

In the present embodiment, the case of performing different kinds of processing in first through third process blocks B3-B5 has been explained. Alternatively, each of first through third process blocks B3-B5 may conduct the same kind of processing, or two of first through third process blocks B3-B5 may conduct the same kind of processing while the remaining process block conducts a different kind of processing. Further, in the case where processing is to be conducted using the same kinds of process units in each of first through third process blocks B3-B5, only the required process units may be mounted in each of process blocks B3-B5, in which case, the first program of the process block control portion only needs to be provided with the function to control the operations of the third transfer means and the respective process units such that predetermined processing is carried out based on a predetermined recipe with respect to the substrates in the process block.

Figure 11:
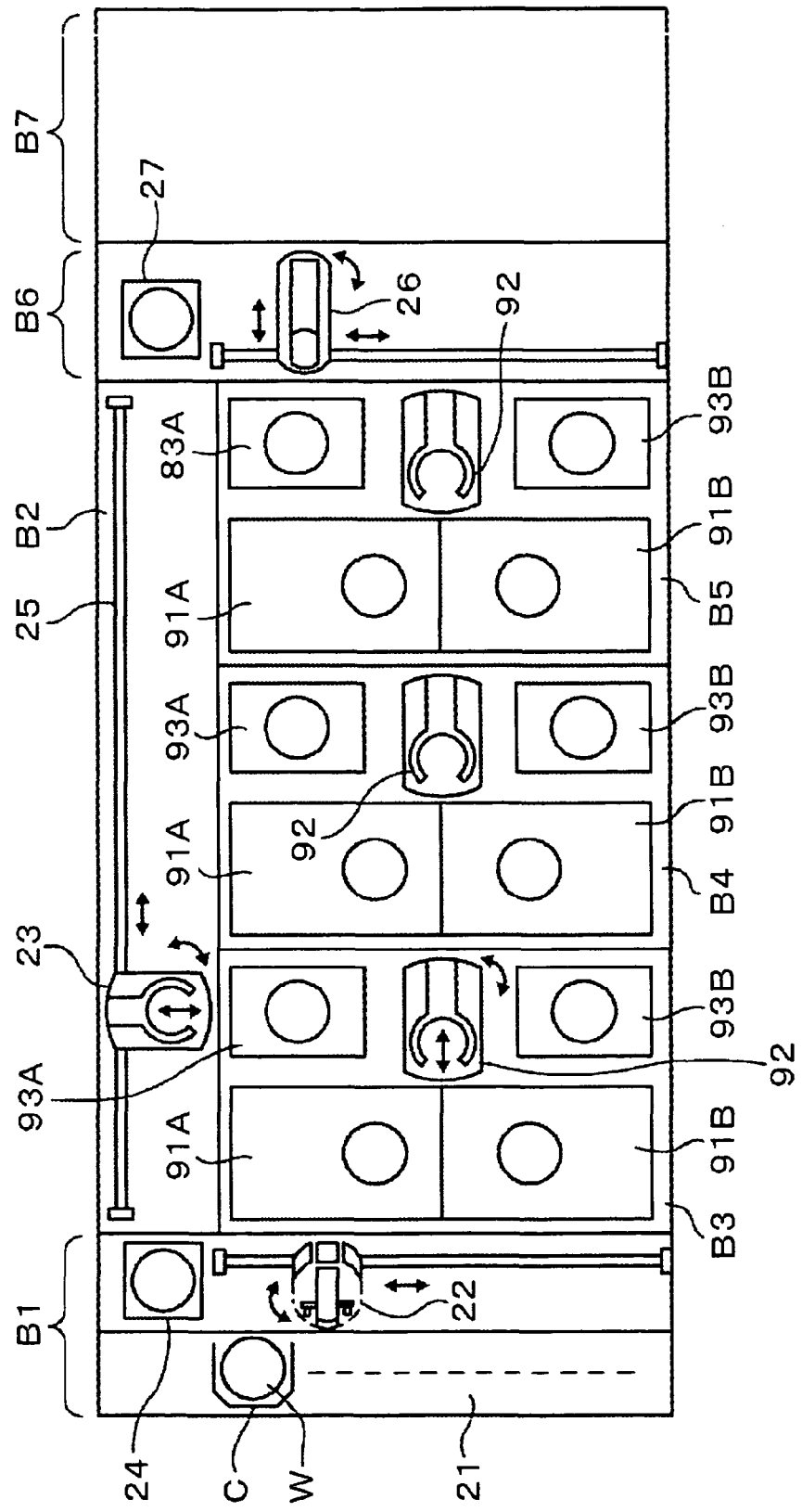
FIG. 11 is a top plan view illustrating another embodiment of the substrate processing apparatus of the present invention.
Figure 12:
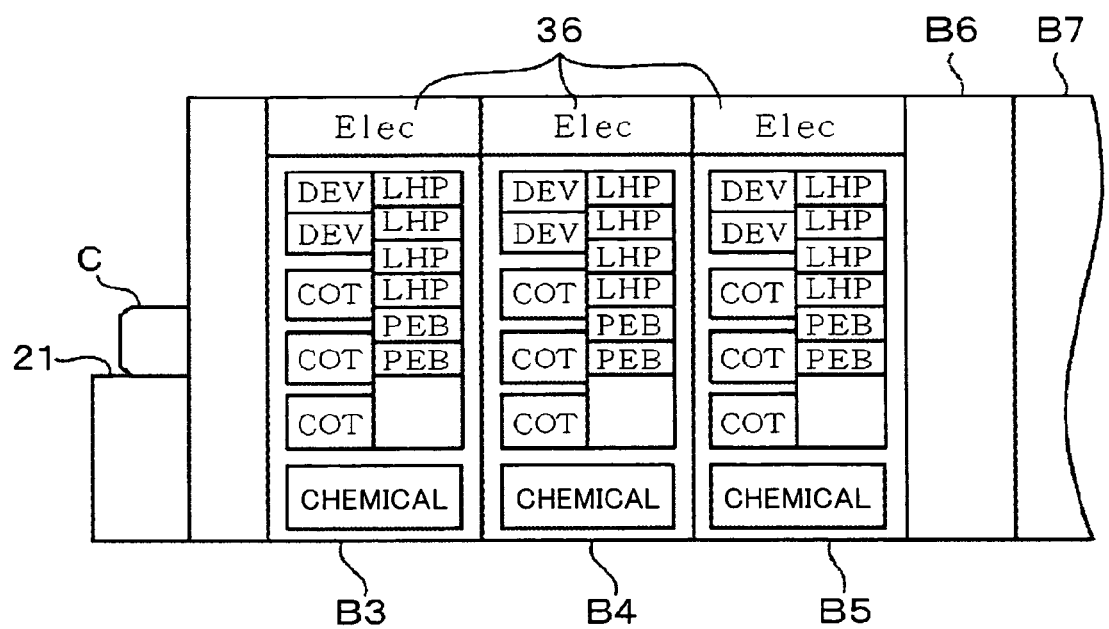
FIG. 12 is a side cross sectional view of the substrate processing apparatus.
Figure 13:
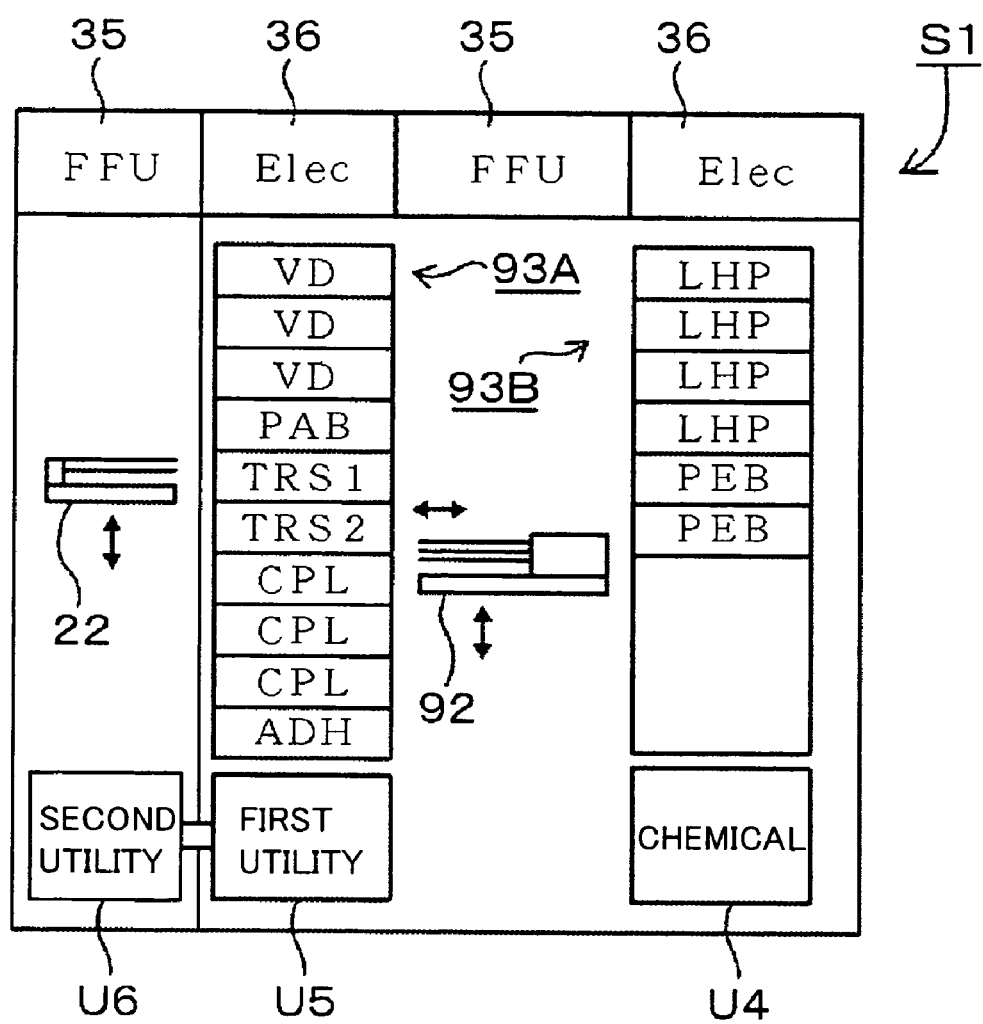
FIG. 13 is a side cross sectional view of the substrate processing apparatus.

Hereinafter, another example of the substrate processing apparatus of the present invention will be described with reference to FIGS. 11-13. The substrate processing apparatus of this example differs from the above example only in the inner configuration of first through third process blocks B3-B5. These process blocks B3-B5 are formed to have the same size and the same layout of process units arranged therein.

More specifically, on the front side as seen from carrier block B1, two liquid process unit groups 91A, 91B each having liquid process-related process units in multiple stages, e.g., five stages, are provided, and on the back side thereof, two shelf units 93A, 93B each having heating/cooling-related process units in multiple stages, e.g., ten stages and six stages, respectively, are provided, with third transfer means 92 sandwiched therebetween. Third transfer means 92 delivers wafers W between liquid process unit groups 91A, 91B and shelf units 93A, 93B. Further, shelf unit 93A on the transfer block B2 side is provided with a delivery unit (TRS1, TRS2) at the position accessible by second transfer means 23 of transfer block B2, serving as the delivery stage for delivering wafers W between second transfer means 23 and third transfer means 92.

As such, in each of process blocks B3-B5, as in the case of, e.g., the above embodiment, for example three coating-related units (COT) 32, two developing units (DEV) 33, three vacuum drying units (VD), four heating units (LHP), one heating unit for pre-baking (PAB), two heating units (PEB) for post-exposure baking, three temperature regulating units (CPL), one hydrophobic process unit (ADH), and additionally, two delivery units (TRS1, TRS2) are provided.

In this example, as in the case of the above embodiment, a series of processing are completed in units of the process blocks, and the processed states of wafers W in the respective process blocks are kept track. Second transfer means 23 transfers wafer W on first delivery stage 24 to the process block in which the last wafer W does not exist or in which the final step for the last wafer W will be finished earliest.

Figure 14:
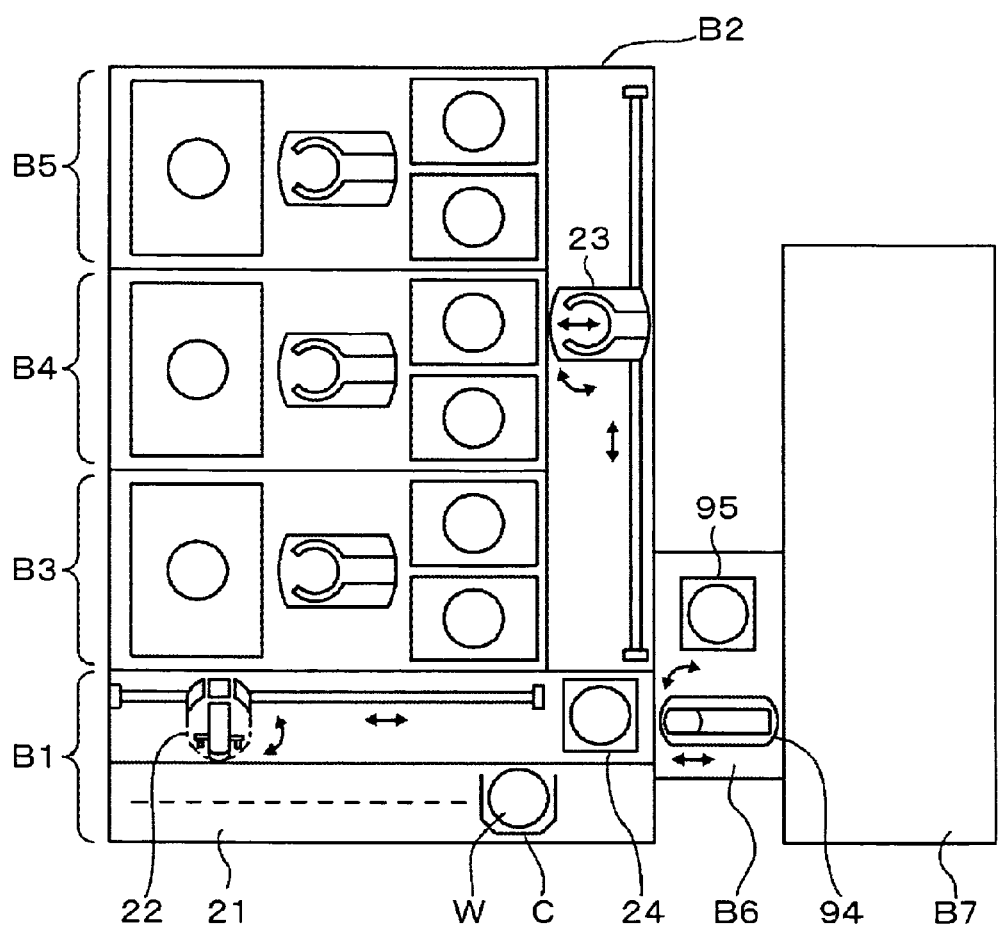
FIG. 14 is a top plan view illustrating another embodiment of the substrate processing apparatus of the present invention.

Further, the substrate processing apparatus of the present invention is not limited to the configuration where light exposure device B7 is connected via interface portion B6 to the side of transfer block B2 opposite to the side connected to carrier block B1. It may be configured as shown in FIG. 14, for example, such that light exposure device B7 is connected via interface portion B6 to the side of transfer block B2 opposite to the side connected to process blocks B3-B5. In this case, as shown in FIG. 14 for example, interface portion B6 is provided with a delivery stage 95 for delivering wafers W between second transfer means 23 of transfer block B2 and delivery means 94 of interface portion B6. Here, the layout in each process block may be as shown in FIG. 1, or as shown in FIG. 10.

Figure 6:
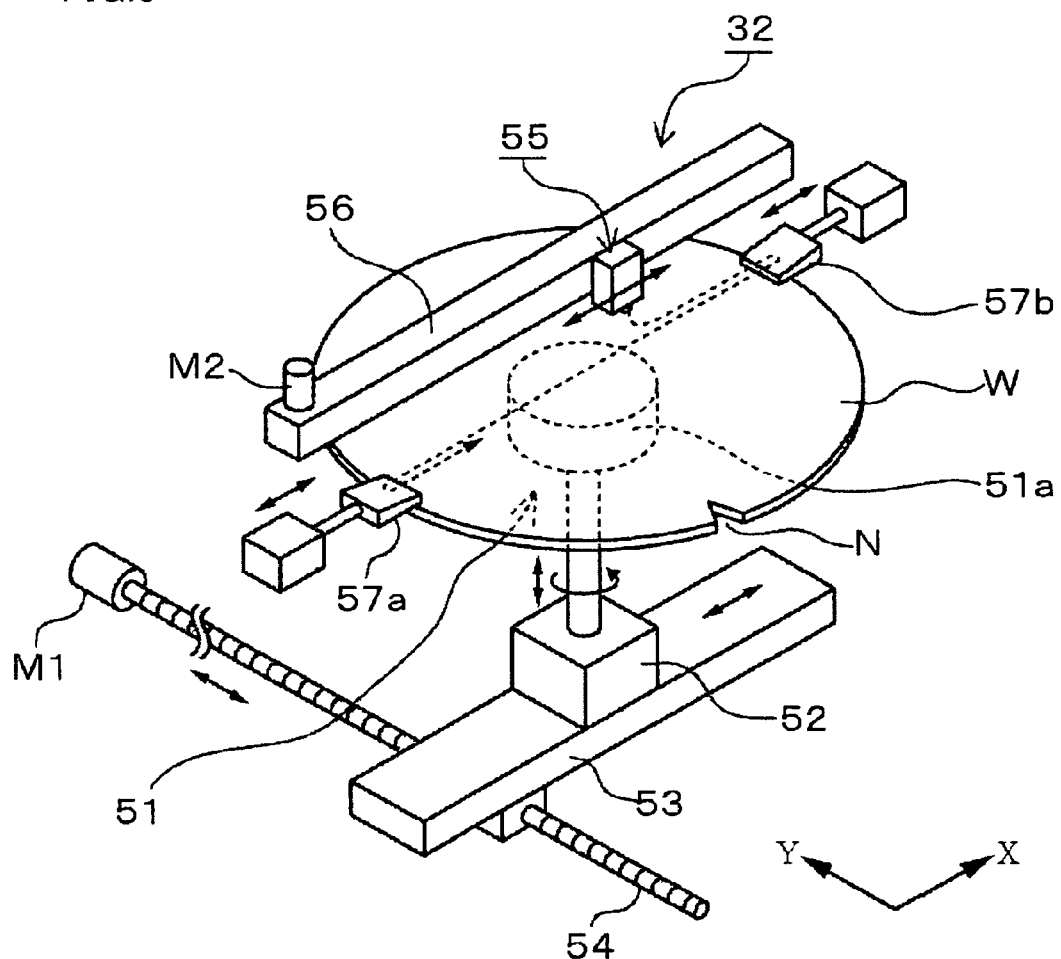
FIG. 6 is a cross sectional view of a coating unit provided in the substrate processing apparatus.

The coating-related unit of the present invention is not limited to the above-described device shown in FIG. 6. It may be configured such that wafer W is placed on a substrate holding portion that holds the same rotatably around a vertical axis, and a coating solution is supplied from a coating solution nozzle provided near the center of rotation of wafer W while rotating wafer W, to cause the coating solution to spread on the wafer surface by centrifugal force of rotation. In this case, the vacuum drying step following application of the coating solution is unnecessary, so that it is preferable that the process block is mounted with a heating unit (LHP) or other unit instead of the vacuum drying unit (VD).

Further, in the present invention, besides the configuration where the light exposure device is connected to the process block(s), the light exposure device may be separated from the process block(s) and provided at a different location. In this case, wafer W in carrier C of carrier block B1 is transferred via first transfer means 22 and second transfer means 23 to a prescribed process block to be subjected to resist solution coating processing, for example, and then returned to carrier block B1 again via second transfer means 23 and first transfer means 22, and thereafter, the relevant wafer W is transferred to the light exposure device arranged at the different location to be subjected to prescribed light exposure processing. Wafer W having undergone the light exposure processing is returned via carrier block B1, first transfer means 22 and second transfer means 23 to the original process block where the resist solution was applied, and prescribed developing processing is carried out therein. It is then again returned via second transfer means 23 and first transfer means 22 to the original carrier C within carrier block B1.

Further, in the substrate processing apparatus of the present invention, a heating unit (PEB) may be mounted in interface portion B6, for example, and in the case where the time between the light exposure processing and the succeeding heating processing in the heating unit (PEB) needs to be uniform, as in the case of using a chemically amplified resist solution for example, wafer W having undergone the light exposure processing in light exposure device B7 may be transferred preferentially to the heating unit (PEB) within a prescribed period of time by delivery means 26. In this case, besides delivery means 26 in interface portion B6, a sub-transfer arm 96 dedicated to transfer via light exposure device B7→heating unit (PEB) may be provided, as shown, e.g., in FIGS. 15A and 15B.

Figure 15A:
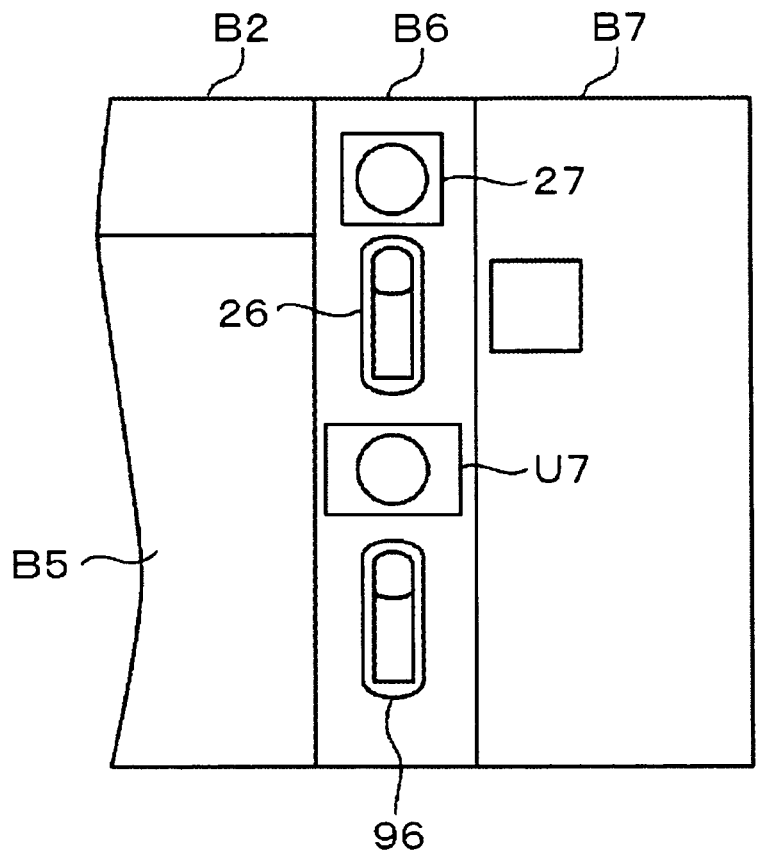
FIG. 15A is a top plan view illustrating another embodiment of the substrate processing apparatus of the present invention.
Figure 15B:
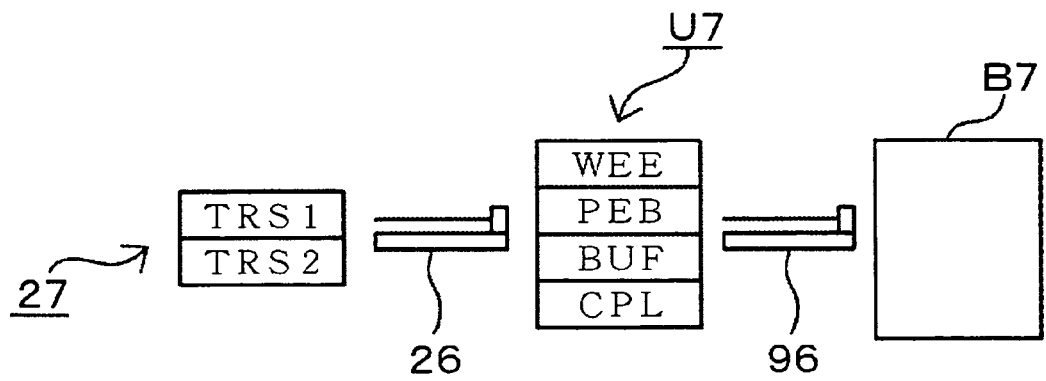
FIG. 15B is a top plan view illustrating the other embodiment of the substrate processing apparatus of the present invention.
Figure 16:
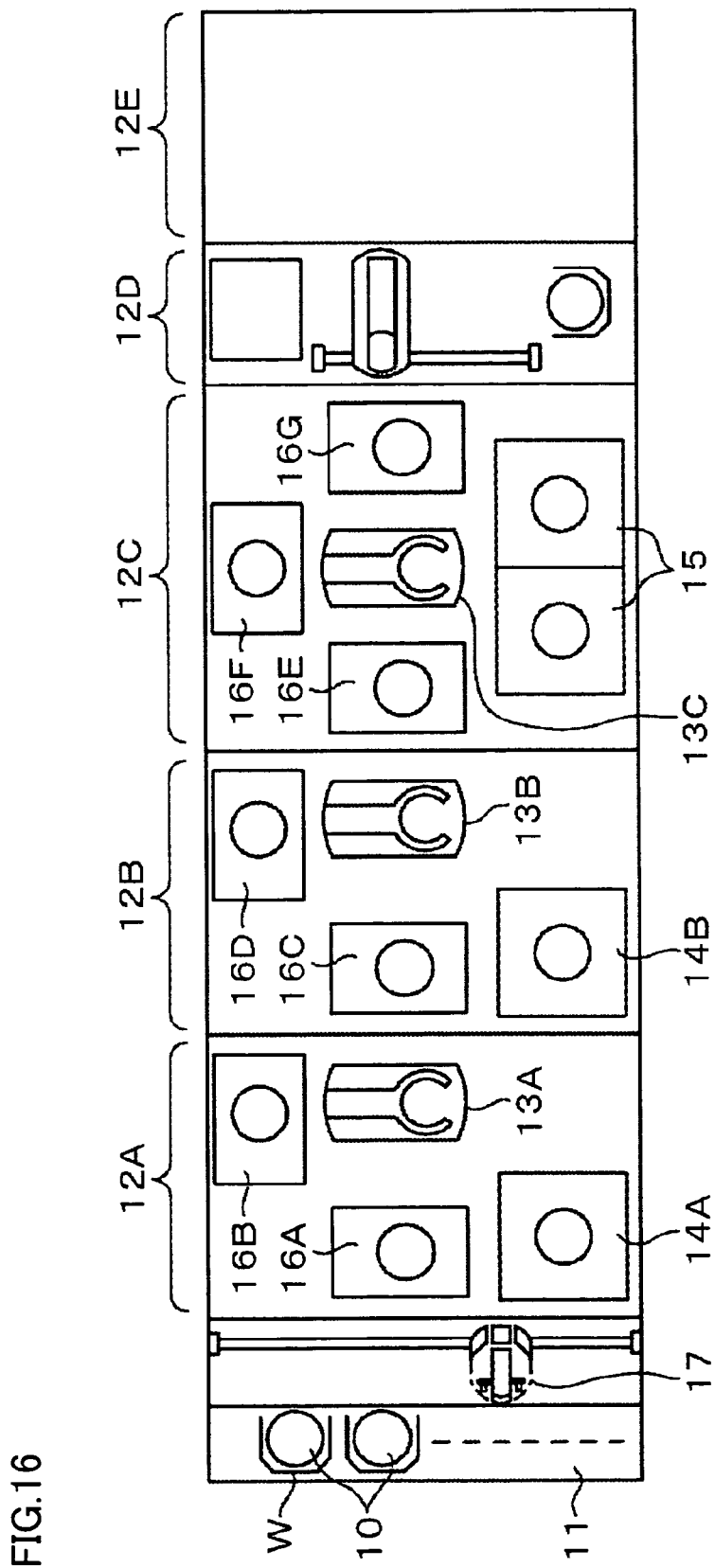
FIG. 16 is a top plan view illustrating a conventional substrate processing apparatus.

In the example shown in FIGS. 15A and 15B, a shelf unit U7 provided with a peripheral light exposure device (WEE), a buffer cassette (BUF), a temperature regulating unit (CPL), and a heating unit (PEB) is arranged between delivery means 26 and sub-transfer arm 96. Wafer W is transferred by delivery means 26 in the order of, e.g., delivery stage 27→peripheral light exposure device (WEE)→buffer cassette (BUF)→temperature regulating unit (CPL). Thereafter, wafer W of temperature regulating unit (CPL) is transferred by sub-transfer arm 96 in the order of light exposure device B7→heating unit (PEB), and then, wafer W in heating unit (PEB) is transferred again by delivery means 26 in the order of buffer cassette (BUF)→delivery stage 27. Further, it may be configured such that the peripheral light exposure device is not provided. In this case as well, wafer W is transferred in a similar manner as described above, except that processing with the peripheral light exposure device is not conducted.

Further, the configuration of the substrate processing apparatus of the present invention is not limited to the one described above, as long as a series of processing are completed in each process block, and wafer W within carrier block B1 is transferred via second transfer means 23 of transfer block B2 to a process block to be subjected to predetermined processing. Further, the numbers and types of the process units as well as the layout thereof within the respective process blocks may be different from each other, as long as the process blocks have the same size in two dimensions. Furthermore, the same kind of processing or the different kinds of processing may be carried out in the process blocks, as described above. Still further, the present invention is not only applicable to the case of transferring first wafers of different lots, but also applicable to the case of transferring the succeeding wafers in the same lot. In this case as well, unoccupied process block B3-B5 is determined and the wafer is transferred thereto. This can suppress the state where transfer to process block B3-B5 is awaited, whereby throughput can be improved.

More specifically, in the case where substrate carrier (C) stores first and second lots of wafers W as a plurality of substrates, assume that the last wafer in the first lot is being processed in any of process blocks B3, B4, B5, and the remaining process block B3, B4, or B5 is not processing wafers. In such a case, means (83) for controlling the second transfer means controls the second transfer means (23) to transfer the first wafer W in the second lot to the relevant process block B3, B4 or B5 where processing is not being conducted, so that wafer W is processed in that process block B3, B4 or B5.

It may be configured not to include a light exposure device, or it may be applied, e.g., to processing of forming an interlayer insulating film, or to processing of forming a SOG (Spin On Glass) film on the substrate. In the present invention, the substrate is not limited to the semiconductor wafer, but may be, e.g., a glass substrate for a liquid crystal display, or a photo-mask substrate.

Figure 17:
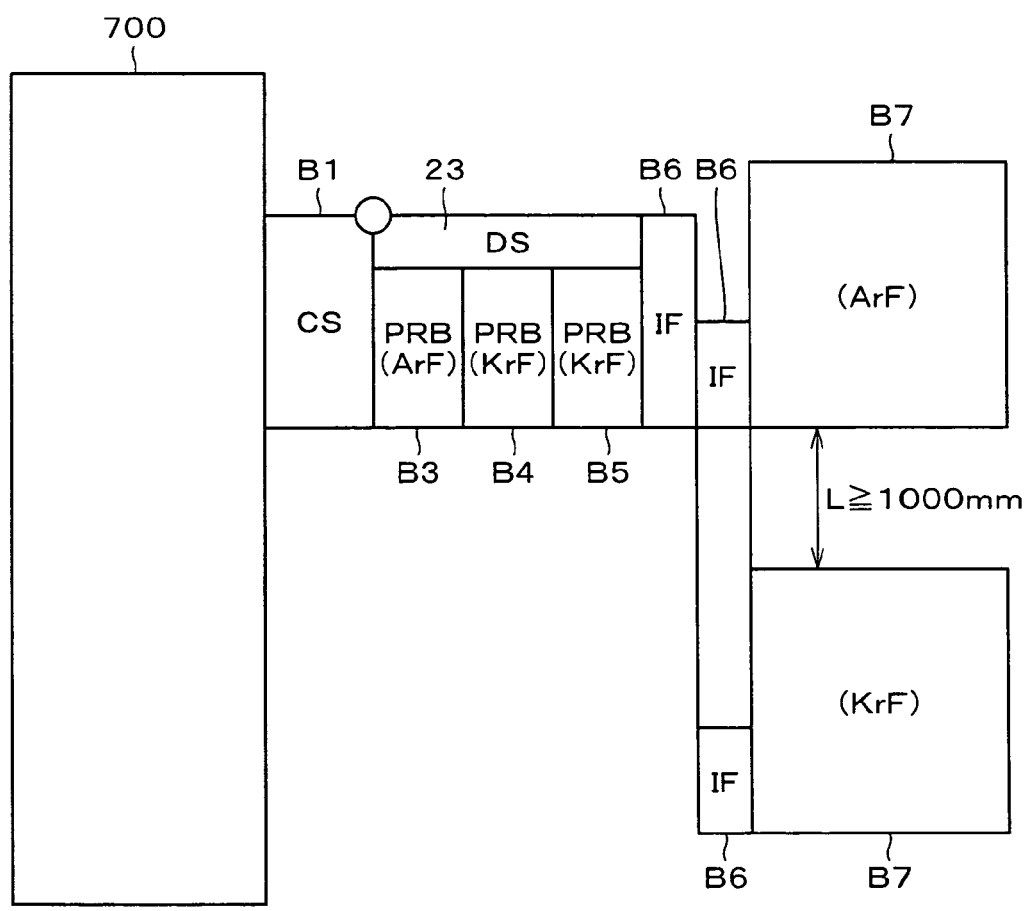
FIG. 17 is a top plan view illustrating another embodiment of the substrate processing apparatus of the present invention.

Further, it may be configured to include a plurality of light exposure devices. FIG. 17 shows an example for sharing the light exposure devices. Light exposure devices B7 include an ArF exposure machine and a KrF exposure machine, and a distance L between two light exposure devices B7 is not less than 1000 mm. Both light exposure devices B7 are connected to a coating and developing device via interface portion B6. A space permitting operation and maintenance is secured between light exposure devices B7. The exposure machines are capable of simultaneous processing, and process blocks B3, B4, B5 having PRB of coating and developing therefor are connected. When an EB (electron beam) exposure machine is connected as light exposure device B7 for production of various kinds of items with small quantities, parallel processing by the light exposure machines can realize improvement of TP (throughput). It is noted that in FIG. 17, the lots of wafers are introduced from a loading path 700 to carrier block B1 having a carrier station CS, and then introduced to process blocks B3, B4, B5 via second transfer means 23 incorporated in a docking station DS.

The invention claimed is:
1. A substrate processing apparatus, comprising:
a carrier block including a carrier placement portion to/from which a substrate carrier storing a plurality of substrates is loaded/unloaded, and first transfer means for performing delivery of the substrate with respect to the substrate carrier placed on the carrier placement portion;
second transfer means provided adjacent to the carrier block and for transferring the substrate along a linear transfer path extending in a lateral direction;
a first delivery stage for performing delivery of the substrate between said first transfer means and said second transfer means;
a plurality of process blocks each including a plurality of process units for performing predetermined processing on the substrate, third transfer means for transferring the substrate between the plurality of process units in each of the process blocks of the plurality of process blocks, and a second delivery stage for performing delivery of the substrate between said second transfer means and said third transfer means, said plurality of process blocks being provided with respect to a main body of the apparatus to be arranged along said transfer path, and performing a series of substrate processing on the substrates in units of the plurality of process blocks;
a process block control portion controlling operations of said third transfer means and the respective process units and outputting processing information of the substrates within the corresponding process block such that prede- termined processing is performed on the substrates in each of the process blocks based on a predetermined recipe; and a controller programmed to determine a process block where there is no substrate or where a final step for the last substrate within the relevant process block will be finished earliest based on the processing information of the substrates from the process block control portions before the substrate is delivered from the first delivery stage to the second transfer means, and for controlling the second transfer means to transfer the substrate on said first delivery stage to the relevant process block;

each of said plurality of process blocks including a coating unit for applying a resist solution to the substrate, a developing unit for performing developing processing on the substrate after exposure to light, a heating unit for heating the substrate, the third transfer means for transferring the substrate between the coating, developing, and heating units, and the second delivery stage for performing delivery of the substrate between said second transfer means and said third transfer means, and such application of the resist solution and/or the developing processing after exposure to light being performed on the substrate in units of each process block.

2. The substrate processing apparatus according to claim 1, wherein first and second lots containing a plurality of substrates are stored in said substrate carrier, and said means for controlling the second transfer means controls the second transfer means such that, when the last substrate in said first lot is being processed in one of said process blocks, if the other process block is not performing substrate processing, the first substrate in the second lot is transferred to that process block portion which is not performing the processing to allow the substrate to be processed in the relevant process block portion.

3. The substrate processing apparatus according to claim 1, wherein an interface portion to which a light exposure device is connected is connected to a side of said transfer path opposite to a side connected to the carrier block.

4. The substrate processing apparatus according to claim 1, wherein an interface portion to which a light exposure device is connected is connected to a side of said transfer path opposite to a side connected to the process blocks.

5. The substrate processing apparatus according to claim 1, wherein each process block of the plurality of process blocks includes a plurality of the coating units, a plurality of the developing units, and a plurality of the heating units, and said process block control portion further includes a function to select the coating unit, the developing unit, and the heating unit for use in the processing based on the process recipe of the substrate.

6. The substrate processing apparatus according to claim 1, wherein each process block includes a liquid process unit performing processing on the substrate using a chemical solution, a heating unit for heating the substrate, the third transfer means for transferring the substrate between the units, and the second delivery stage for performing delivery of the substrate between said second transfer means and said third transfer means, and a series of processing are performed on the substrate in units of each process block.

7. The substrate processing apparatus according to claim 6, wherein each process block of the plurality of process blocks includes a plurality of the liquid process units and a plurality of the heating units, and said process block control portion further includes a function to select the liquid process unit and the heating unit for use in the processing based on the process recipe of the substrate.

8. The substrate processing apparatus according to claim 6, wherein said liquid process unit is for forming a coating film.

9. The substrate processing apparatus according to claim 6, wherein said liquid process unit is for coating the substrate with a chemical solution containing a precursor of an insulating film.

10. The substrate processing apparatus according to claim 1, wherein said plurality of process blocks are formed to have the same size in two dimensions.

11. The substrate processing apparatus according to claim 1, wherein said second transfer means is provided at a transfer block that extends along an arrangement of the plurality of process blocks, and each process block is configured to be attachable to and detachable from the transfer block.

* * * * *